United States Patent
Yang et al.

(10) Patent No.: US 10,790,079 B2
(45) Date of Patent: Sep. 29, 2020

(54) THIN FILM INDUCTOR, POWER CONVERSION CIRCUIT, AND CHIP

(71) Applicant: Huawei Technologies Co., Ltd., Shenzhen (CN)

(72) Inventors: Shijun Yang, Fuzhou (CN); Heqian Yang, Dongguan (CN); Yongfa Zhu, Dongguan (CN); Wei Chen, Fuzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/559,231

(22) Filed: Sep. 3, 2019

(65) Prior Publication Data

US 2020/0005985 A1    Jan. 2, 2020

Related U.S. Application Data

(63) Continuation of application No. PCT/CN2018/077885, filed on Mar. 2, 2018.

(30) Foreign Application Priority Data

Mar. 3, 2017 (CN) .......................... 2017 1 0124036
May 26, 2017 (CN) .......................... 2017 1 0386290

(51) Int. Cl.
  *H01F 27/245* (2006.01)
  *H01F 10/16* (2006.01)
  (Continued)

(52) U.S. Cl.
  CPC ........... *H01F 27/245* (2013.01); *H01F 10/16* (2013.01); *H01F 41/32* (2013.01); *H01L 28/10* (2013.01); *H02M 3/158* (2013.01)

(58) Field of Classification Search
  CPC .......... H01F 27/245; H01F 41/32; H01F 3/02; H01F 27/32; H01F 27/323; H01F 27/324; H01F 41/063
  See application file for complete search history.

(56) References Cited

U.S. PATENT DOCUMENTS 5,355,301 A * 10/1994 Saito .................... H01F 17/0006
                                          323/282
6,278,352 B1    8/2001 Huang et al.
(Continued)

FOREIGN PATENT DOCUMENTS

CN        1524273 A     8/2004
CN      101017727 A     8/2007
(Continued)

OTHER PUBLICATIONS

Machine Translation and Abstract of Chinese Publication No. CN101017727, Aug. 15, 2007, 29 pages.
(Continued)

*Primary Examiner* — Gary L Laxton
(74) *Attorney, Agent, or Firm* — James Anderson Harrison

(57) ABSTRACT

A thin film inductor includes a first magnetic thin film and a second magnetic thin film that are adjacent, the first magnetic thin film is nested in the second magnetic thin film, and a relative magnetic permeability of the first magnetic thin film is less than a relative magnetic permeability of the second magnetic thin film, and a difference between the relative magnetic permeability of the first magnetic thin film and the relative magnetic permeability of the second magnetic thin film is greater than or equal to a first threshold, where when a magnetic induction intensity of the second magnetic thin film reaches a saturated magnetic induction intensity of the second magnetic thin film, a magnetic
(Continued)

induction intensity of the first magnetic thin film is less than or equal to a saturated magnetic induction intensity of the first magnetic thin film.

20 Claims, 10 Drawing Sheets

(51) Int. Cl.
*H01F 41/32* (2006.01)
*H01L 49/02* (2006.01)
*H02M 3/158* (2006.01)

(56) References Cited

U.S. PATENT DOCUMENTS

| | | | |
|---|---|---|---|
| 6,603,382 | B1 | 8/2003 | Komai et al. |
| 6,822,548 | B2 | 11/2004 | Wang et al. |
| 7,803,470 | B2 | 9/2010 | Ikeda |
| 8,102,236 | B1* | 1/2012 | Fontana, Jr. ........ H01F 17/0006 336/200 |
| 9,679,671 | B2* | 6/2017 | Yoon ................. H01L 23/49894 |
| 2002/0150790 | A1 | 10/2002 | Ikeda et al. |
| 2006/0151195 | A1 | 7/2006 | Donazzi et al. |
| 2008/0198560 | A1 | 8/2008 | Fujiwara et al. |
| 2013/0176095 | A1 | 7/2013 | Fontana, Jr. et al. |
| 2013/0314192 | A1 | 11/2013 | Fontana, Jr. et al. |
| 2015/0138850 | A1 | 5/2015 | Pan et al. |
| 2015/0200231 | A1 | 7/2015 | Herget et al. |
| 2018/0301270 | A1 | 10/2018 | Yang et al. |

FOREIGN PATENT DOCUMENTS

| | | |
|---|---|---|
| CN | 103580502 A | 2/2014 |
| CN | 204375745 U | 6/2015 |
| CN | 105761880 A | 7/2016 |
| CN | 107146690 A | 9/2017 |
| JP | 2002057031 A | 2/2002 |
| JP | 2002309353 A | 10/2002 |
| TW | 451232 B | 8/2001 |

OTHER PUBLICATIONS

Machine Translation and Abstract of Chinese Publication No. CN107146690, Sep. 8, 2017, 26 pages.
Machine Translation and Abstract of Chinese Publication No. CN204375745, Jun. 3, 2015, 16 pages.
Machine Translation and Abstract of Japanese Publication No. JP2002057031, Feb. 22, 2002, 43 pages.
Foreign Communication From a Counterpart Application, Chinese Application No. 201710386290.1, Chinese Office Action dated Jul. 18, 2018, 4 pages.
Foreign Communication From a Counterpart Application, Chinese Application No. 201710386290.1, Chinese Search Report dated Jul. 10, 2018, 2 pages.
Foreign Communication From a Counterpart Application, PCT Application No. PCT/CN2018/077885, English Translation of International Search Report dated Jun. 1, 2018, 2 pages.
Foreign Communication From a Counterpart Application, PCT Application No. PCT/CN2018/077885, English Translation of Written Opinion dated Jun. 1, 2018, 4 pages.
Foreign Communication From a Counterpart Application, European Application No. 18760688.4, Extended European Search Report dated Feb. 5, 2020, 6 pages.

* cited by examiner

THIN FILM INDUCTOR, POWER CONVERSION CIRCUIT, AND CHIP

CROSS-REFERENCE TO RELATED APPLICATIONS

This application is a continuation of International Application No. PCT/CN2018/077885, filed on Mar. 2, 2018, which claims priority to Chinese Patent Application No. 201710124036.4, filed on Mar. 3, 2017 and Chinese Patent Application No. 201710386290.1, filed on May 26, 2017, all of which are hereby incorporated by reference in their entireties.

TECHNICAL FIELD

This application relates to the field of circuits, and more specifically, to a thin film inductor, a power conversion circuit, and a chip.

BACKGROUND

A thin film magnetic core of a thin film inductor is formed by nesting a plurality of layers of magnetic thin films layer upon layer. In the plurality of layers of magnetic thin films, usually, a magnetic induction intensity of an inner layer of magnetic thin film reaches a saturated magnetic induction intensity of the inner layer of magnetic thin film faster than an outer layer of magnetic thin film reaches a saturated magnetic induction intensity of the outer layer of magnetic thin film. When the magnetic induction intensity of the inner layer of magnetic thin film reaches the saturated magnetic induction intensity of the inner layer of magnetic thin film, a relative magnetic permeability of the inner layer of magnetic thin film is close to zero. Consequently, an inductance of the thin film inductor is decreased sharply. When the thin film inductor is located in a power conversion circuit, a current in the power conversion circuit is increased sharply, and a load is burnt out in a severe case.

Therefore, methods of reducing the possibility that the magnetic induction intensity of the inner layer of a magnetic thin film in the foregoing thin film inductor being easily saturated has become a problem that needs to be resolved urgently.

SUMMARY

This application provides a thin film magnetic core, a thin film inductor, and a power conversion circuit, to effectively reduce a possibility that a magnetic induction intensity of an inner layer of magnetic thin film is easily saturated.

According to a first aspect, this application provides a thin film inductor. The thin film inductor includes a thin film magnetic core and at least one electric conductor, the thin film magnetic core is of a cylindrical structure having openings at two ends, the thin film magnetic core includes a plurality of layers of magnetic thin films, each layer of magnetic thin film is of a cylindrical structure having openings at two ends, the plurality of layers of magnetic thin films are nested layer upon layer, each two adjacent layers of magnetic thin films are spaced by an insulation layer, and the at least one electric conductor is located in an inner cavity of an innermost layer of magnetic thin film of the plurality of layers of magnetic thin films, each two adjacent layers of magnetic thin films include an inner layer of magnetic thin film and an outer layer of magnetic thin film, the inner layer of magnetic thin film is nested in the outer layer of magnetic thin film, and a relative magnetic permeability of the inner layer of magnetic thin film is less than or equal to a relative magnetic permeability of the outer layer of magnetic thin film, and the plurality of layers of magnetic thin films include at least a first magnetic thin film and a second magnetic thin film that are adjacent, the first magnetic thin film is nested in the second magnetic thin film, and a relative magnetic permeability of the first magnetic thin film is less than a relative magnetic permeability of the second magnetic thin film, and a difference between the relative magnetic permeability of the first magnetic thin film and the relative magnetic permeability of the second magnetic thin film is greater than or equal to a first threshold, where when a magnetic induction intensity of the second magnetic thin film reaches a saturated magnetic induction intensity of the second magnetic thin film, a magnetic induction intensity of the first magnetic thin film is less than or equal to a saturated magnetic induction intensity of the first magnetic thin film.

Therefore, in the thin film inductor provided in this application, the first magnetic thin film is nested in the second magnetic thin film, but the relative magnetic permeability of the first magnetic thin film is set to be less than the relative magnetic permeability of the second magnetic thin film, and the difference between the relative magnetic permeability of the first magnetic thin film and the relative magnetic permeability of the second magnetic thin film is set to be greater than or equal to 50, so that the magnetic induction intensity of the first magnetic thin film is less than or equal to the saturated magnetic induction intensity of the first magnetic thin film when the magnetic induction intensity of the second magnetic thin film reaches the saturated magnetic induction intensity of the second magnetic thin film. That is, in the thin film inductor provided in this application, the magnetic induction intensity of the first magnetic thin film located at an inner layer reaches the saturated magnetic induction intensity of the first magnetic thin film later than the magnetic induction intensity of the second magnetic thin film located at an outer layer reaches the saturated magnetic induction intensity of the second magnetic thin film, and avoidance of a problem that the second magnetic thin film is magnetically saturated is considered when the second magnetic thin film is set. Therefore, when the first magnetic thin film is not magnetically saturated earlier than the second magnetic thin film, a problem of a sharp decrease in an inductance of the thin film inductor caused when the first magnetic thin film is easily magnetically saturated can be avoided.

With reference to the first aspect, in a first possible implementation of the first aspect, in each two adjacent layers of magnetic thin films, a difference between the relative magnetic permeability of the inner layer of magnetic thin film and the relative magnetic permeability of the outer layer of magnetic thin film is greater than or equal to the first threshold, where when a magnetic induction intensity of the outer layer of magnetic thin film reaches a saturated magnetic induction intensity of the outer layer of magnetic thin film, a magnetic induction intensity of the inner layer of magnetic thin film is less than or equal to a saturated magnetic induction intensity of the inner layer of magnetic thin film.

A relationship between each two adjacent layers of magnetic thin films located in the thin film inductor is set to satisfy a relationship between the first magnetic thin film and the second magnetic thin film, so that each layer of magnetic thin film in the thin film inductor except an outermost layer of magnetic thin film is not magnetically saturated earlier than the outermost layer of magnetic thin film, thereby avoiding a problem of a sharp decrease in an inductance of the thin film inductor caused when a magnetic thin film located at an inner layer of the thin film inductor is easily magnetically saturated.

With reference to the first aspect or the first possible implementation of the first aspect, in a second possible implementation of the first aspect, a value of the first threshold is 50.

With reference to the first aspect, the first possible implementation of the first aspect, or the second possible implementation of the first aspect, in a third possible implementation of the first aspect, when a material of which the first magnetic thin film is made is different from a material of which the second magnetic thin film is made, a thickness value of the first magnetic thin film is equal to a thickness value of the second magnetic thin film.

To achieve an objective that the relative magnetic permeability of the first magnetic thin film is less than the relative magnetic permeability of the second magnetic thin film by at least 50, this objective may be directly achieved by selecting a material, or this objective may be achieved by selecting a material and setting a thickness jointly. In other words, when the first magnetic thin film and the second magnetic thin film are respectively made of different materials, a thickness of the first magnetic thin film may be the same as or different from a thickness of the second magnetic thin film. To reduce process complexity, the thickness of the first magnetic thin film is set to be the same as the thickness of the second magnetic thin film.

With reference to the first aspect, the first possible implementation of the first aspect, or the second possible implementation of the first aspect, in a fourth possible implementation of the first aspect, when a material of which the first magnetic thin film is made is the same as a material of which the second magnetic thin film is made, a thickness value of the first magnetic thin film is greater than a thickness value of the second magnetic thin film, a difference between the thickness value of the first magnetic thin film and the thickness value of the second magnetic thin film is greater than or equal to 0 and is less than or equal to a second threshold, and the second threshold is five times the thickness value of the second magnetic thin film.

In this embodiment, when the first magnetic thin film and the second magnetic thin film are made of a same material, the objective that the relative magnetic permeability of the first magnetic thin film is less than the relative magnetic permeability of the second magnetic thin film by at least 50 is achieved by adjusting a thickness. An advantage lies in that it is unnecessary to pay attention to a shape and a manufacturing manner of each layer of magnetic thin film, and a relative magnetic permeability can be changed by only adjusting a thickness, so that technical implementation is simpler.

With reference to any one of the first aspect, or the first possible implementation of the first aspect to the third possible implementation of the first aspect, in a fifth possible implementation of the first aspect, the first magnetic thin film is made of $Ni_{45}Fe_{55}$, and the second magnetic thin film is made of $Ni_{80}Fe_{20}$, the first magnetic thin film is made of CoZrO, and the second magnetic thin film is made of CoZrTa, the first magnetic thin film is made of CoZrO, and the second magnetic thin film is made of $Ni_{80}Fe_{20}$, or the first magnetic thin film is made of CoZrTa, and the second magnetic thin film is made of $Ni_{80}Fe_{20}$.

With reference to any one of the first aspect, or the first possible implementation of the first aspect to the fifth possible implementation of the first aspect, in a sixth possible implementation of the first aspect, a length direction of each of the at least one electric conductor is the same as a length direction of the innermost layer of magnetic thin film, and the length direction of the innermost layer of magnetic thin film is a direction extending from an opening at one end of the innermost layer of magnetic thin film to an opening at the other end of the innermost layer of magnetic thin film, and each of the at least one electric conductor and an inner wall of the innermost layer of magnetic thin film are insulated from each other, and when the at least one electric conductor is at least two electric conductors, the at least two electric conductors are isolated from each other.

With reference to any one of the first aspect, or the first possible implementation of the first aspect to the sixth possible implementation of the first aspect, in a seventh possible implementation of the first aspect, each layer of magnetic thin film of the thin film inductor includes a first part and a second part, the first part has a first end and a second end, and the first end and the second end are respectively in contact with different areas of the second part.

In this embodiment, the first end and the second end are both directly in contact with the different areas of the second part, that is, the first part is in physical contact with the second part, so that a magnetic resistance is relatively small, to bring an advantage that the inductance of the thin film inductor can be improved.

With reference to any one of the first aspect, or the first possible implementation of the first aspect to the seventh possible implementation of the first aspect, in an eighth possible implementation of the first aspect, a circumference of the second magnetic thin film in a first plane and the saturated magnetic induction intensity of the second magnetic thin film need to be considered for selection of the relative magnetic permeability of the second magnetic thin film, where a first direction is a direction extending from an opening at one end of the second magnetic thin film to an opening at the other end of the second magnetic thin film, and the first plane is a plane in which a cross section of the second magnetic thin film is located and the first plane is perpendicular to the first direction.

With reference to any one of the first aspect, or the first possible implementation of the first aspect to the seventh possible implementation of the first aspect, in a ninth possible implementation of the first aspect, a circumference of the first magnetic thin film in a first plane and the saturated magnetic induction intensity of the first magnetic thin film need to be considered for selection of the relative magnetic permeability of the first magnetic thin film, where a first direction is a direction extending from an opening at one end of the first magnetic thin film to an opening at the other end of the first magnetic thin film, and the first plane is a plane in which a cross section of the first magnetic thin film is located and the first plane is perpendicular to the first direction.

With reference to any one of the first aspect, or the first possible implementation of the first aspect to the ninth possible implementation of the first aspect, in a tenth possible implementation of the first aspect, a thickness $d_1$ of the thin film magnetic core satisfies a condition, 0 micrometers$<d_1\leq$50 micrometers.

With reference to the tenth possible implementation of the first aspect, in an eleventh possible implementation of the first aspect, a thickness $d_2$ of each of the plurality of layers of magnetic thin films satisfies a condition, 0 micrometers$<d_2\leq$10 micrometers.

With reference to the tenth possible implementation of the first aspect or the eleventh possible implementation of the first aspect, in a twelfth possible implementation of the first aspect, a thickness $d_3$ of each insulation layer satisfies a condition, 0 micrometers$<d_3\leq 2$ micrometers.

According to a second aspect, this application provides a power conversion circuit. The power conversion circuit includes a first switching transistor, a second switching transistor, a capacitor, and the thin film inductor according to the first aspect or any possible implementation of the first aspect, one end of the first switching transistor is connected to one end of the second switching transistor, one end of the thin film inductor is connected between the one end of the first switching transistor and the one end of the second switching transistor, and the other end of the thin film inductor is connected to one end of the capacitor, the other end of the capacitor is connected to the other end of the second switching transistor, when the first switching transistor is switched on and the second switching transistor is switched off, a current flowing through the thin film inductor becomes larger, and when the first switching transistor is switched off and the second switching transistor is switched on, a voltage between two ends of the capacitor is reversely loaded on the thin film inductor, and a current flowing through the thin film inductor becomes smaller.

In the power conversion circuit provided in this application, because the inner layer of magnetic thin film of the used thin film inductor is magnetically saturated earlier than the outer layer of magnetic thin film, the thin film inductor can normally operate. That is, an inductance of the thin film inductor is not abruptly decreased to be close to zero, so that a device in the power conversion circuit in which the thin film inductor is used is not burnt out because of an excessively large current.

According to a third aspect, this application provides a chip. The chip includes the power conversion circuit according to the second aspect and a load, and the power conversion circuit is connected to the load and is configured to supply power to the load.

In the chip provided in this application, because the inner layer of magnetic thin film of the used thin film inductor is magnetically saturated earlier than the outer layer of magnetic thin film, the thin film inductor can normally operate. That is, an inductance of the thin film inductor is not abruptly decreased to be close to zero, so that a device in the power conversion circuit in which the thin film inductor is used is not burnt out because of an excessively large current. Further, security performance of the chip is also improved.

According to a fourth aspect, an embodiment of this application provides a thin film magnetic core, where the thin film magnetic core is formed into a cavity structure, each of two ends of the cavity structure is of an opening shape, the thin film magnetic core includes a plurality of layers of magnetic thin films, and each two adjacent layers of magnetic thin films are spaced by an insulation layer, and the plurality of layers of magnetic thin films include a first layer of magnetic thin film and a second layer of magnetic thin film, and the first layer of magnetic thin film is nested in the second layer of magnetic thin film, where a saturated magnetic induction intensity of the first layer of magnetic thin film is greater than a saturated magnetic induction intensity of the second layer of magnetic thin film, a difference between the saturated magnetic induction intensity of the first layer of magnetic thin film and the saturated magnetic induction intensity of the second layer of magnetic thin film is greater than a first threshold, and when a magnetic permeability of the first layer of magnetic thin film is greater than a magnetic permeability of the second layer of magnetic thin film, a difference between the magnetic permeability of the first layer of magnetic thin film and the magnetic permeability of the second layer of magnetic thin film is less than a second threshold, so that a magnetic induction intensity of the first layer of magnetic thin film is less than the saturated magnetic induction intensity of the first layer of magnetic thin film, or a magnetic permeability of the first layer of magnetic thin film is less than a magnetic permeability of the second layer of magnetic thin film, a difference between the magnetic permeability of the first layer of magnetic thin film and the magnetic permeability of the second layer of magnetic thin film is greater than a third threshold, and when a saturated magnetic induction intensity of the first layer of magnetic thin film is less than a saturated magnetic induction intensity of the second layer of magnetic thin film, a difference between the saturated magnetic induction intensity of the first layer of magnetic thin film and the saturated magnetic induction intensity of the second layer of magnetic thin film is less than a fourth threshold, so that a magnetic induction intensity of the first layer of magnetic thin film is less than the saturated magnetic induction intensity of the first layer of magnetic thin film.

Therefore, in the thin film magnetic core provided in this embodiment of this application, the saturated magnetic induction intensity of the first layer of magnetic thin film (that is, the inner layer of magnetic thin film) is greater than the saturated magnetic induction intensity of the second layer of magnetic thin film (that is, the outer layer of magnetic thin film), so that the magnetic induction intensity that the first layer of magnetic thin film can accommodate can be effectively increased, or the magnetic permeability of the first layer of magnetic thin film is less than the magnetic permeability of the second layer of magnetic thin film, so that the magnetic induction intensity of the first layer of magnetic thin film can be effectively reduced. Therefore, both may effectively reduce a possibility that the magnetic induction intensity of the first layer of magnetic thin film is easily saturated. Moreover, compared with the problem of a relatively small inductance caused by only use of the magnetic thin film of low magnetic permeability performance to reduce the magnetic induction intensity of the first layer of magnetic thin film, this embodiment of this application can also effectively ensure an inductance of the thin film inductor.

With reference to the fourth aspect, in a first possible implementation of the fourth aspect, a thickness of the first layer of magnetic thin film is greater than a thickness of the second layer of magnetic thin film, so that the magnetic permeability of the first layer of magnetic thin film is less than the magnetic permeability of the second layer of magnetic thin film.

With reference to the fourth aspect, in a second possible implementation of the fourth aspect, a difference between a thickness of the first layer of magnetic thin film and a thickness of the second layer of magnetic thin film is less than a fifth threshold, and the fifth threshold is three times the thickness of the second layer of magnetic thin film.

With reference to the fourth aspect, in a third possible implementation of the fourth aspect, the magnetic permeability of the first layer of magnetic thin film is determined based on a circumference of the first layer of magnetic thin film in a first plane and the saturated magnetic induction intensity of the first layer of magnetic thin film, the magnetic permeability of the second layer of magnetic thin film is determined based on a circumference of the second layer of magnetic thin film in the first plane and the saturated magnetic induction intensity of the second layer of magnetic thin film, the first plane is a plane in which a cross section of the cavity structure is located and the first plane is perpendicular to a first direction, and the first direction is a direction extending from an opening at one end of the cavity structure to an opening at the other end.

With reference to the fourth aspect, in a fourth possible implementation of the fourth aspect, the plurality of layers of magnetic thin films further include a third layer of magnetic thin film, the third layer of magnetic thin film is nested in the second layer of magnetic thin film, and the third layer of magnetic thin film is nested in the first layer of magnetic thin film, or the first layer of magnetic thin film is nested in the third layer of magnetic thin film, where a saturated magnetic induction intensity of the third layer of magnetic thin film is the same as the saturated magnetic induction intensity of the first layer of magnetic thin film, or a magnetic permeability of the third layer of magnetic thin film is the same as the magnetic permeability of the first layer of magnetic thin film, both a circumference of the third layer of magnetic thin film in a first plane and a circumference of the first layer of magnetic thin film in the first plane fall within a first circumference range, the first plane is a plane in which a cross section of the cavity structure is located and the first plane is perpendicular to a first direction, and the first direction is a direction extending from an opening at one end of the cavity structure to an opening at the other end, and the plurality of layers of magnetic thin films further include a fourth layer of magnetic thin film, the second layer of magnetic thin film is nested in the fourth layer of magnetic thin film, or the fourth layer of magnetic thin film is nested in the second layer of magnetic thin film, and the third layer of magnetic thin film and the first layer of magnetic thin film are both nested in the fourth layer of magnetic thin film, where a saturated magnetic induction intensity of the fourth layer of magnetic thin film is the same as the saturated magnetic induction intensity of the second layer of magnetic thin film, or a magnetic permeability of the fourth layer of magnetic thin film is the same as the magnetic permeability of the second layer of magnetic thin film, and both a circumference of the fourth layer of magnetic thin film in the first plane and a circumference of the second layer of magnetic thin film in the first plane fall within a second circumference range, and a lower limit value of the second circumference range is greater than an upper limit value of the first circumference range.

Therefore, in the thin film magnetic core provided in this embodiment of this application, the plurality of layers of magnetic thin films in the thin film magnetic core belong to at least two magnetic thin film groups, magnetic permeabilities or saturated magnetic induction intensities in each magnetic thin film group are the same, and magnetic permeabilities of a group of inner layers of magnetic thin films are less than magnetic permeabilities of a group of outer layers of magnetic thin films, or saturated magnetic induction intensities of a group of inner layers of magnetic thin films are greater than saturated magnetic induction intensities of a group of outer layers of magnetic thin films, so that not only a possibility that a magnetic induction intensity of an inner layer of magnetic thin film can be reduced, but also complexity of a manufacturing process can be reduced, thereby reducing costs.

With reference to the fourth aspect, in a fifth possible implementation of the fourth aspect, a thickness $d_1$ of the thin film magnetic core satisfies a condition, 0 micrometers<$d_1$≤5 micrometers.

With reference to the fourth aspect, in a sixth possible implementation of the fourth aspect, a thickness $d_2$ of each of the plurality of layers of magnetic thin films satisfies a condition, 0 micrometers<$d_2$≤1 micrometers.

With reference to the fourth aspect, in a seventh possible implementation of the fourth aspect, a thickness $d_3$ of each insulation layer satisfies a condition, 0 micrometers<$d_3$≤20 micrometers.

According to a fifth aspect, an embodiment of this application provides a thin film inductor. The thin film inductor includes the thin film magnetic core according to any possible implementation of the fourth aspect, where the thin film magnetic core is formed into a cavity structure, and each of two ends of the cavity structure is of an opening shape, and at least one electric conductor, where the at least one electric conductor is located in the cavity structure, a length direction of the at least one electric conductor is the same as a first direction, and the first direction is a direction extending from an opening at one end of the cavity structure to an opening at the other end.

According to a sixth aspect, an embodiment of this application provides a power conversion circuit. The power conversion circuit includes a direct current power supply, at least one switch unit, and at least one inductor unit, where each of the at least one inductor unit corresponds to one of the at least one switch unit, each of the at least one inductor unit is connected to the direct current power supply using a corresponding switch unit, and the inductor unit includes the thin film inductor according to any implementation of the second aspect.

According to a seventh aspect, an embodiment of this application provides a method for manufacturing a thin film inductor. The manufacturing method includes configuring a thin film magnetic core, where the thin film magnetic core is formed into a cavity structure, each of two ends of the cavity structure is of an opening shape, the thin film magnetic core includes a plurality of layers of magnetic thin films, and each two adjacent layers of magnetic thin films are spaced by an insulation layer, and the plurality of layers of magnetic thin films include a first layer of magnetic thin film and a second layer of magnetic thin film, and the first layer of magnetic thin film is nested in the second layer of magnetic thin film, where a saturated magnetic induction intensity of the first layer of magnetic thin film is greater than a saturated magnetic induction intensity of the second layer of magnetic thin film, a difference between the saturated magnetic induction intensity of the first layer of magnetic thin film and the saturated magnetic induction intensity of the second layer of magnetic thin film is greater than a first threshold, and when a magnetic permeability of the first layer of magnetic thin film is greater than a magnetic permeability of the second layer of magnetic thin film, a difference between the magnetic permeability of the first layer of magnetic thin film and the magnetic permeability of the second layer of magnetic thin film is less than a second threshold, so that a magnetic induction intensity of the first layer of magnetic thin film is less than the saturated magnetic induction intensity of the first layer of magnetic thin film, or a magnetic permeability of the first layer of magnetic thin film is less than a magnetic permeability of the second layer of magnetic thin film, a difference between the magnetic permeability of the first layer of magnetic thin film and the magnetic permeability of the second layer of magnetic thin film is greater than a third threshold, and when a saturated magnetic induction intensity of the first layer of magnetic thin film is less than a saturated magnetic induction intensity of the second layer of magnetic thin film, a difference between the saturated magnetic induction intensity of the first layer of magnetic thin film and the saturated magnetic induction intensity of the second layer of magnetic thin film is less than a fourth threshold, so that a magnetic induction intensity of the first layer of magnetic thin film is less than the saturated magnetic induction intensity of the first layer of magnetic thin film, and placing at least one electric conductor in the cavity structure, where a length direction of the at least one electric conductor is the same as a first direction, and the first direction is a direction extending from an opening at one end of the cavity structure to an opening at the other end.

DESCRIPTION OF EMBODIMENTS

The following clearly and completely describes the technical solutions in the embodiments of this application with reference to the accompanying drawings in the embodiments of this application.

It should be understood that, a thin film inductor of the embodiments of this application may be applied to a power conversion system, and may also be applied to another circuit. This is not limited in the embodiments of this application.

Figure 1:
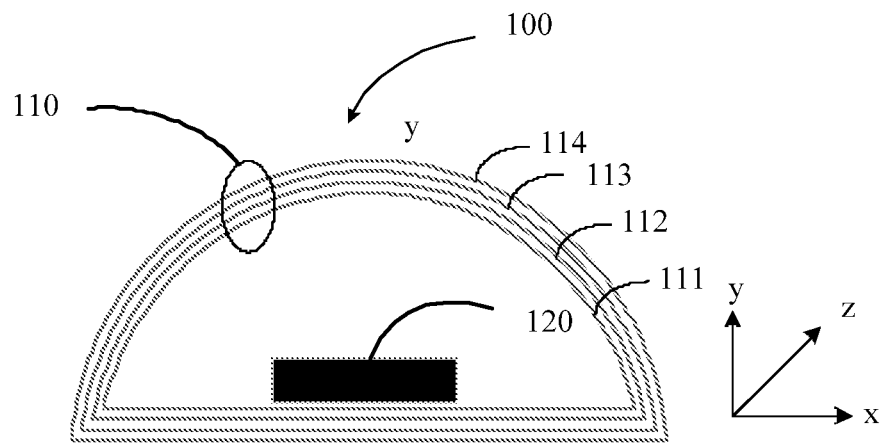
FIG. 1 is a structural cross-sectional view of a thin film inductor.

First, a thin film inductor is described simply. Referring to FIG. 1, FIG. 1 is a cross-sectional view of the thin film inductor. A thin film inductor 100 includes a thin film magnetic core 110 and an electric conductor 120, and the electric conductor 120 is located in an inner cavity of the thin film magnetic core 110. After the electric conductor 120 is powered on, a flux path generated by each layer of magnetic thin film in the thin film magnetic core 110 is an annular path of the corresponding magnetic thin film in the cross-sectional view shown in FIG. 1. To reduce an eddy current loss on the thin film magnetic core 110, the thin film magnetic core 110 usually includes a plurality of layers of magnetic thin films, the plurality of layers of magnetic thin films are nested layer upon layer, each layer of magnetic thin film is of a cylindrical structure, and circumferences of all layers of magnetic thin films on a plane in which a cross section shown in FIG. 1 is located are different. Referring to FIG. 1, the thin film inductor comprises a magnetic thin film 111, a magnetic thin film 112, a magnetic thin film 113, and a magnetic thin film 114. Using the magnetic thin film 111 and the magnetic thin film 112 shown in FIG. 1 as an example, the magnetic thin film 111 close to the electric conductor 120 is an inner layer of magnetic thin film, and relatively, the magnetic thin film 112 away from the electric conductor 120 is an outer layer of magnetic thin film. A circumference of the magnetic thin film 111 is less than a circumference of the magnetic thin film 112, and correspondingly, an equivalent length of a flux path of the magnetic thin film 111 is also less than an equivalent length of a flux path of the magnetic thin film 112. This means that a magnetic resistance of the magnetic thin film 111 is less than a magnetic resistance of the magnetic thin film 112, and correspondingly, the magnetic thin film 111 has a larger magnetic induction intensity (which may also be understood as a flux density) than that of the magnetic thin film 112. Then, under a same condition, compared with the magnetic thin film 112, it is very easy for a magnetic induction intensity of the magnetic thin film 111 first to reach a magnetic saturation state earlier. Consequently, a relative magnetic permeability of the magnetic thin film 111 is close to zero, and then an inductance of the thin film inductor 100 decreases sharply. Correspondingly, a current in a power conversion circuit in which the thin film inductor 100 is used increases sharply, and a component in the power conversion circuit is even burnt out in a severe case.

It should be noted that, each layer of magnetic thin film has a thickness, each layer of magnetic thin film has an inner surface and an outer surface. It should be learned that, a length of a flux path of the inner surface is less than a length of a flux path of the outer surface. Referring to FIG. 1, the length of the flux path is a length of the flux path on the plane in which the cross section shown in FIG. 1 is located. Because each layer of magnetic thin film has a thickness, it is not easy to accurately determine a length of a flux path of the magnetic thin film. Therefore, "an equivalent length of a flux path of a magnetic thin film" is used above to describe a length of the flux path of the magnetic thin film. It is easily understood that, an equivalent length of a flux path of a magnetic thin film is between a length of a magnetic path of an inner surface of the magnetic thin film and a length of a magnetic path of an outer surface of the magnetic thin film.

Second, with reference to FIG. 1, a relationship between parameters is described using the following formulas, $R=L/\mu_0\mu_r A$, where R is a magnetic resistance of a layer of magnetic thin film, L is an equivalent length of flux loop generated by the powered-on electric conductor in the layer of magnetic thin film, $\mu_0$ is a vacuum magnetic permeability, $\mu_r$ is a relative magnetic permeability of the magnetic thin film, A is a product of a thickness of the layer of magnetic thin film and a length of the layer of magnetic thin film, and the length of the layer of magnetic thin film is a length extending from an opening at one end of a cylindrical structure of the layer of magnetic thin film to an opening at the other end, $\phi=NI/R$, where $\phi$ is a flux generated by the powered-on electric conductor in the magnetic thin film, N is a quantity of turns of a coil of the electric conductor, and I is a current flowing through the electric conductor, and $B=\phi/A$, where B is a magnetic induction intensity generated by the layer of magnetic thin film, and it may be learned based on the foregoing three formulas, $B=NI\mu_0\mu_r/L$, that is, when parameters N, I, $\mu_0$, and $\mu_r$ are all the same, the magnetic induction intensity B is inversely proportional to the equivalent length L of the flux path of the magnetic thin film.

This further proves that, when a saturated magnetic induction intensity of the inner layer of magnetic thin film is the same as a saturated magnetic induction intensity of the outer layer of magnetic thin film, and parameters N, I, $\mu_0$, and $\mu_r$ of the inner layer of magnetic thin film are also the same as those of the outer layer of magnetic thin film, because a length L of the inner layer of magnetic thin film is smaller, the inner layer of magnetic thin film reaches a magnetic saturation state faster than the outer layer of magnetic thin film does.

Figure 2:
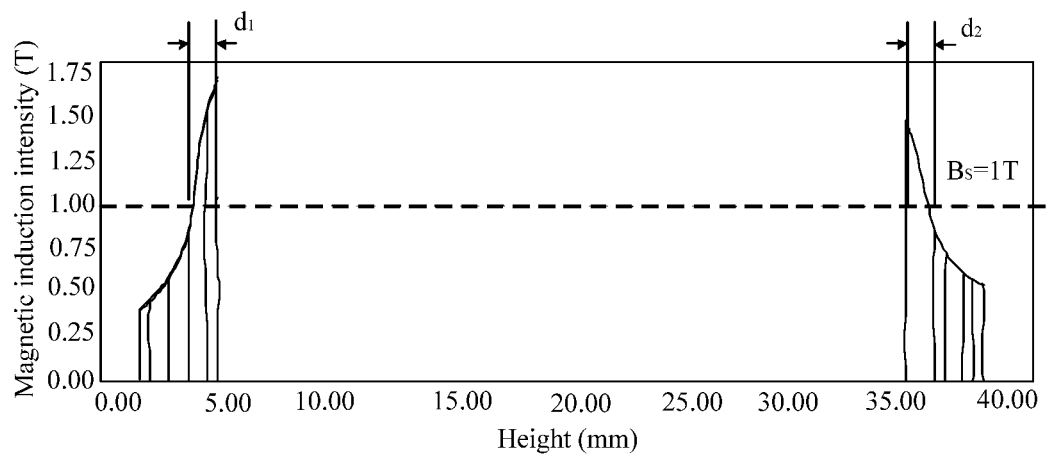
FIG. 2 is a distribution diagram of a magnetic induction intensity of a magnetic copper-clad thin film inductor made of a material of $Ni_{80}Fe_{20}$.

FIG. 2 is a distribution diagram of a magnetic induction intensity of a magnetic copper-clad thin film inductor made of a material of $Ni_{80}Fe_{20}$. A latitudinal axis in a horizontal direction shown in FIG. 2 is a y-axis direction shown in FIG. 1, and a coordinate range corresponding to the latitudinal axis is an area of 40 mm of the thin film inductor in the y-axis direction shown in FIG. 1. A longitudinal axis in a vertical direction shown in FIG. 2 is used to indicate a magnetic induction intensity of a magnetic thin film in the thin film inductor. A maximum magnetic induction intensity $B_S$ of $Ni_{80}Fe_{20}$ is 1 T. It may be learned from FIG. 2 that, a magnetic induction intensity of a magnetic thin film in a range of an area $d_1$ and an area $d_2$ (that is, a magnetic thin film that is close to the electric conductor and that includes the magnetic thin film 112) is greater than or equal to the maximum magnetic induction intensity of the material, to reach a saturation state. Consequently, a relative magnetic permeability of a magnetic thin film that is magnetically saturated is close to zero, and then the inductance of the thin film inductor decreases sharply.

Figure 3:
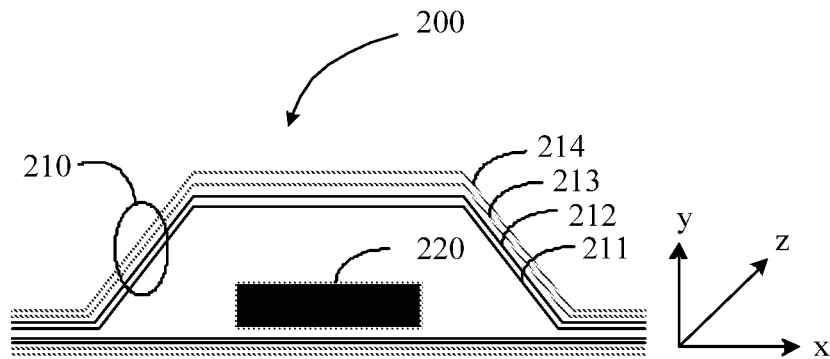
FIG. 3 is a structural cross-sectional view of a thin film inductor according to this application.

This application provides a thin film inductor. Referring to FIG. 3, FIG. 3 is a structural cross-sectional view of a thin film inductor according to this application. As shown in FIG. 3, a thin film inductor 200 includes a thin film magnetic core 210 and at least one electric conductor 220, the thin film magnetic core 200 is of a cylindrical structure having openings at two ends, the thin film magnetic core 200 includes a plurality of layers of magnetic thin films (211, 212, 213, and 214), each layer of magnetic thin film is of a cylindrical structure having openings at two ends, the plurality of layers of magnetic thin films are nested layer upon layer, each two adjacent layers of magnetic thin films are spaced by an insulation layer, and the at least one electric conductor 220 is located in an inner cavity of an innermost layer of magnetic thin film 211 of the plurality of layers of magnetic thin films.

Each two adjacent layers of magnetic thin films include an inner layer of magnetic thin film and an outer layer of magnetic thin film, the inner layer of magnetic thin film is nested in the outer layer of magnetic thin film, and a relative magnetic permeability of the inner layer of magnetic thin film is less than or equal to a relative magnetic permeability of the outer layer of magnetic thin film. The plurality of layers of magnetic thin films include at least a first magnetic thin film and a second magnetic thin film that are adjacent, the first magnetic thin film is nested in the second magnetic thin film, and a relative magnetic permeability of the first magnetic thin film is less than a relative magnetic permeability of the second magnetic thin film, and a difference between the relative magnetic permeability of the first magnetic thin film and the relative magnetic permeability of the second magnetic thin film is greater than or equal to a first threshold, where when a magnetic induction intensity of the second magnetic thin film reaches a saturated magnetic induction intensity of the second magnetic thin film, a magnetic induction intensity of the first magnetic thin film is less than or equal to a saturated magnetic induction intensity of the first magnetic thin film.

In an embodiment of this application, the first threshold is 50.

Figure 4:
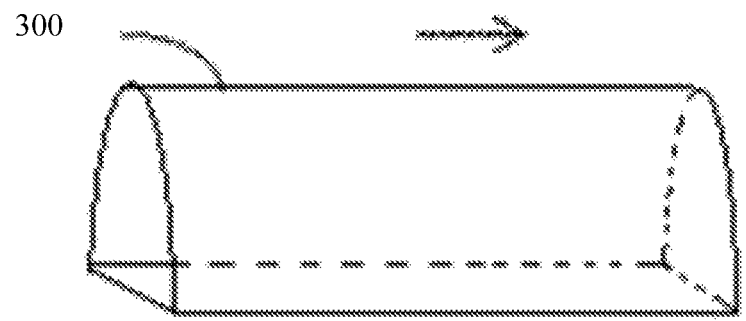
FIG. 4 is a side view of a thin film inductor according to this application.

It should be noted that, for "the thin film magnetic core 100 of a cylindrical structure having openings at two ends", refer to a thin film inductor shown in FIG. 4. FIG. 4 is an external structural diagram of a thin film inductor 300 according to this application. It is easily learned that, both two ends of the thin film inductor 300 are of an opening shape, and a cylindrical structure is located between the two ends. It should be further noted that, a direction pointed by an arrow in FIG. 4 is a direction extending from an opening at one end of the thin film inductor 300 to an opening at the other end.

It should be noted that, that a plurality of layers of magnetic thin films are nested layer upon layer may be understood as that shapes of the plurality of layers of magnetic thin films are the same, but only sizes are different. In an embodiment, in the plurality of layers of magnetic thin films nested layer upon layer, a size of a magnetic thin film located at an outer layer is greater than a size of a magnetic thin film located at inner layer. The thin film inductor shown in FIG. 3 is used as an example to perform description. Referring to FIG. 3, when the magnetic thin film 212 is compared with the magnetic thin film 211 to, the magnetic thin film 212 is an outer layer of magnetic thin film, and the magnetic thin film 211 is an inner layer of magnetic thin film. When a Y axis is used to indicate a direction in which a height of a magnetic thin film is located, and an X axis is used to indicate a direction in which a width of a magnetic thin film is located, a height of the magnetic thin film 212 is greater than a height of the magnetic thin film 211, and a width of the magnetic thin film 212 is greater than a width of the magnetic thin film 211.

It should be noted that, a relative magnetic permeability $\mu_r$ of a magnetic thin film is a ratio of a magnetic permeability $\mu$ of the magnetic thin film to a vacuum magnetic permeability $$\mu_0 : \mu_r = \frac{\mu}{\mu_0}.$$

The magnetic permeability $\mu$ of the magnetic thin film is a degree of magnetization of the magnetic thin film in linear response to an externally applied magnetic field. The vacuum magnetic permeability $\mu_0$ is also referred to as a magnetic field constant, a magnetic constant, or a magnetic permeability of free space, and is a physical constant. In the international unit system, a value of the vacuum magnetic permeability is, $\mu_0=4\pi\times10^{-7} V\cdot s/(A\cdot m) \approx$ 1.2566370614 . . . $\times10^{-6} H\cdot m$ or $N\cdot A^{-2}$ or $T\cdot m/A$ or $Wb/(A\cdot m)$.

It should be learned that, a magnetic permeability of a magnetic thin film is not only related to a material of which the magnetic thin film is made, but also related to a factor such as a thickness of the magnetic thin film or a manufacturing technique. The manufacturing technique includes performance such as a sputtering voltage, a power, or a temperature. Correspondingly, a relative magnetic permeability of a magnetic thin film is also not only related to a material of which the magnetic thin film is made, but also related to a factor such as a thickness of the magnetic thin film or a manufacturing technique.

The magnetic induction intensity is also referred to as a magnetic flux density or a flux density, is a physical quantity indicating a flux running through a standard area, is indicated with a symbol B, and has a derived unit of T in the international unit system. The saturated magnetic induction intensity is a saturated flux density. After a magnetic field is applied to a magnet, as an intensity of the magnetic field increases, a flux density also increases accordingly. However, the flux density has a limit value. After the flux density reaches this limit value, the flux density cannot increase even if the intensity of the magnetic field still increases. In other words, the saturated flux density is reached.

A saturated magnetic induction intensity of a magnetic thin film is related to only a material of which the magnetic thin film is made. When a material of which a magnetic thin film is made is determined, a saturated magnetic induction intensity of the magnetic thin film is also determined. If two magnetic thin films are respectively made of different materials, saturated magnetic induction intensities of these two magnetic thin films are usually different.

It should be noted that, a material of which the foregoing insulation layer is made may be a coating made of silicon dioxide, silicon nitride, or another insulation organic material.

It should be noted that, a layer quantity of the plurality of layers of magnetic thin films is two or more than two. However, in actual application, the layer quantity of the plurality of layers of magnetic thin films is usually more than ten.

For a setting that "the plurality of layers of magnetic thin films include at least a first magnetic thin film and a second magnetic thin film that are adjacent, the first magnetic thin film is nested in the second magnetic thin film", in an embodiment of this application, the first magnetic thin film may be an innermost layer of magnetic thin film (for example, the magnetic thin film 211 shown in FIG. 3) of the plurality of layers of magnetic thin films. In another embodiment of this application, the second magnetic thin film may be an outermost layer of magnetic thin film (for example, the magnetic thin film 214 shown in FIG. 3) of the plurality of layers of magnetic thin films. In still another embodiment of this application, the first magnetic thin film is not an innermost layer of magnetic thin film of the plurality of layers of magnetic thin films (the first magnetic thin film is, for example, the magnetic thin film 212 shown in FIG. 3), and the second magnetic thin film is not an outermost layer of magnetic thin film of the plurality of layers of magnetic thin films (the second magnetic thin film is, for example, the magnetic thin film 213 shown in FIG. 3).

If the layer quantity of the plurality of layers of magnetic thin films is two, the first magnetic thin film is inevitably an innermost layer of magnetic thin film, and the second magnetic thin film is inevitably an outermost layer of magnetic thin film.

When the layer quantity of the plurality of layers of magnetic thin films is three, if the first magnetic thin film is an innermost layer of magnetic thin film of the plurality of layers of magnetic thin films, a relative magnetic permeability of an outermost layer of magnetic thin film is greater than or equal to a relative magnetic permeability of the second magnetic thin film.

Optionally, a difference between the relative magnetic permeability of the outermost layer of magnetic thin film and the relative magnetic permeability of the second magnetic thin film is greater than or equal to the first threshold, and when a magnetic induction intensity of the outermost layer of magnetic thin film reaches a saturated magnetic induction intensity of the outermost layer of magnetic thin film, a magnetic induction intensity of the second magnetic thin film is less than or equal to a saturated magnetic induction intensity of the second magnetic thin film.

When the layer quantity of the plurality of layers of magnetic thin films is three, if the second magnetic thin film is an outermost layer of magnetic thin film of the plurality of layers of magnetic thin films, a relative magnetic permeability of the first magnetic thin film is greater than or equal to a relative magnetic permeability of the innermost layer of magnetic thin film.

Optionally, a difference between the relative magnetic permeability of the first magnetic thin film and the relative magnetic permeability of the innermost layer of magnetic thin film is greater than or equal to the first threshold, and when a magnetic induction intensity of the first magnetic thin film reaches a saturated magnetic induction intensity of the first magnetic thin film, a magnetic induction intensity of the innermost layer of magnetic thin film is less than or equal to a saturated magnetic induction intensity of the innermost layer of magnetic thin film.

When the layer quantity of the plurality of layers of magnetic thin films is four or more than four (referring to FIG. 3), if the first magnetic thin film is an innermost layer of magnetic thin film (for example, the magnetic thin film 211 shown in FIG. 3) of the plurality of layers of magnetic thin films, a relative magnetic permeability of a magnetic thin film (for example, the magnetic thin film 213 shown in FIG. 3) that is located at an outer side of the second magnetic thin film (for example, the magnetic thin film 212 shown in FIG. 3) and that is adjacent to the second magnetic thin film is greater than or equal to a relative magnetic permeability of the second magnetic thin film, and in each two adjacent layers of magnetic thin films located at the outer side of the second magnetic thin film, a relative magnetic permeability of an outer layer of magnetic thin film (for example, the magnetic thin film 214 shown in FIG. 3) is greater than or equal to a relative magnetic permeability of an inner layer of magnetic thin film (for example, the magnetic thin film 213 shown in FIG. 3), where in the two adjacent layers of magnetic thin films, the inner layer of magnetic thin film is nested in the outer layer of magnetic thin film.

Optionally, a difference between a relative magnetic permeability of a magnetic thin film that is located at an outer side of the second magnetic thin film and that is adjacent to the second magnetic thin film and a relative magnetic permeability of the second magnetic thin film is greater than or equal to the first threshold, and when a magnetic induction intensity of the magnetic thin film that is located at the outer side of the second magnetic thin film and that is adjacent to the second magnetic thin film reaches a saturated magnetic induction intensity of the magnetic thin film that is located at the outer side of the second magnetic thin film and that is adjacent to the second magnetic thin film, a magnetic induction intensity of the second magnetic thin film is less than or equal to a saturated magnetic induction intensity of the second magnetic thin film. Moreover, in each two adjacent layers of magnetic thin films located at the outer side of the second magnetic thin film, a difference between a relative magnetic permeability of an outer layer of magnetic thin film and a relative magnetic permeability of an inner layer of magnetic thin film is greater than or equal to the first threshold, and when a magnetic induction intensity of the outer layer of magnetic thin film reaches a saturated magnetic induction intensity of the outer layer of magnetic thin film, a magnetic induction intensity of the inner layer of magnetic thin film is less than or equal to a saturated magnetic induction intensity of the inner layer of magnetic thin film.

When the layer quantity of the plurality of layers of magnetic thin films is four or more than four (referring to FIG. 3), if the second magnetic thin film is an outermost layer of magnetic thin film (for example, the magnetic thin film 214 shown in FIG. 3) of the plurality of layers of magnetic thin films, a relative magnetic permeability of the first magnetic thin film (for example, the magnetic thin film 213 shown in FIG. 3) is greater than or equal to a relative magnetic permeability of a magnetic thin film (for example, the magnetic thin film 212 shown in FIG. 3) that is located at an inner side of the first magnetic thin film and that is adjacent to the first magnetic thin film, and in each two adjacent layers of magnetic thin films located at the inner side of the first magnetic thin film, a relative magnetic permeability of an outer layer of magnetic thin film (for example, the magnetic thin film 212 shown in FIG. 3) is greater than or equal to a relative magnetic permeability of an inner layer of magnetic thin film (for example, the magnetic thin film 211 shown in FIG. 3), where in the two adjacent layers of magnetic thin films, the inner layer of magnetic thin film is nested in the outer layer of magnetic thin film.

Optionally, a difference between a relative magnetic permeability of the first magnetic thin film and a relative magnetic permeability of a magnetic thin film that is located at an inner side of the first magnetic thin film and that is adjacent to the first magnetic thin film is greater than or equal to the first threshold, and when a magnetic induction intensity of the first magnetic thin film reaches a saturated magnetic induction intensity of the first magnetic thin film, a magnetic induction intensity of the magnetic thin film that is located at the inner side of the first magnetic thin film and that is adjacent to the first magnetic thin film is less than or equal to a saturated magnetic induction intensity of the magnetic thin film that is located at the inner side of the first magnetic thin film and that is adjacent to the first magnetic thin film. Moreover, in each two adjacent layers of magnetic thin films located at the inner side of the first magnetic thin film, a difference between a relative magnetic permeability of an outer layer of magnetic thin film and a relative magnetic permeability of an inner layer of magnetic thin film is greater than or equal to the first threshold, and when a magnetic induction intensity of the outer layer of magnetic thin film reaches a saturated magnetic induction intensity of the outer layer of magnetic thin film, a magnetic induction intensity of the inner layer of magnetic thin film is less than or equal to a saturated magnetic induction intensity of the inner layer of magnetic thin film.

It can be learned based on the foregoing description that, in each two adjacent layers of magnetic thin films of the plurality of layers of magnetic thin films, an inner layer of magnetic thin film is not magnetically saturated earlier than an outer layer of magnetic thin film to resolve a problem of a sharp decrease in an inductance of the thin film inductor caused when an inner layer of magnetic thin film is magnetically saturated earlier than an outer layer of magnetic thin film.

In an embodiment of this application, when a material of which the first magnetic thin film is made is the same as a material of which the second magnetic thin film is made, to achieve an objective that the relative magnetic permeability of the first magnetic thin film is less than the relative magnetic permeability of the second magnetic thin film by the first threshold, optionally, a thickness value of the first magnetic thin film is greater than a thickness value of the second magnetic thin film, a difference between the thickness value of the first magnetic thin film and the thickness value of the second magnetic thin film is less than or equal to a second threshold, and the second threshold is five times the thickness value of the second magnetic thin film.

With reference to the foregoing description, it should be learned that, in addition to a material selected for a magnetic thin film and a thickness of the magnetic thin film, there are other factors that affect a relative magnetic permeability of the magnetic thin film, for example, a circumference of the magnetic thin film and a manufacturing technique of the magnetic thin film. Therefore, when a thickness of the first magnetic thin film and a thickness of the second magnetic thin film are set, a person skilled in the art should learn that, the setting further needs to be performed with reference to other affecting factors such as a circumference of a magnetic thin film and a manufacturing technique of the magnetic thin film. It should be noted that, the circumference of the magnetic thin film is a circumference of a cross section of the magnetic thin film in a first plane, and the first plane is perpendicular to a direction extending from an opening end of the magnetic thin film to the other opening end. Additionally, when the first magnetic thin film and the second magnetic thin film are made of a same material, the saturated magnetic induction intensity of the first magnetic thin film is the same as the saturated magnetic induction intensity of the second magnetic thin film.

It should be learned that, when a material of which the first magnetic thin film is made is the same as a material of which the second magnetic thin film is made, to achieve an objective that the relative magnetic permeability of the first magnetic thin film is less than the relative magnetic permeability of the second magnetic thin film by the first threshold, optionally, the first magnetic thin film and the second magnetic thin film are respectively manufactured using different manufacturing techniques (for example, sputtering voltages, powers, and temperatures).

In another embodiment of this application, when a material of which the first magnetic thin film is made is different from a material of which the second magnetic thin film is made, optionally, a thickness value of the first magnetic thin film is equal to a thickness value of the second magnetic thin film. Factors that affect a relative magnetic permeability of a magnetic thin film include a material of which the magnetic thin film is made, a thickness of the magnetic thin film, a circumference of the magnetic thin film, a manufacturing technique of the magnetic thin film, and the like. When the material of which the first magnetic thin film is made is different from the material of which the second magnetic thin film is made, to achieve an objective that a relative magnetic permeability of the first magnetic thin film is less than a relative magnetic permeability of the second magnetic thin film by at least the first threshold, the thickness value of the first magnetic thin film may be equal to the thickness value of the second magnetic thin film when other factors are set to be the same. Therefore, the technique is simpler and is easily implemented.

It should be learned that, when a material of which the first magnetic thin film is made is different from a material of which the second magnetic thin film is made, optionally, a thickness value of the first magnetic thin film is different from a thickness value of the second magnetic thin film. In this case, a material of which the first magnetic thin film is made and a material of which the second magnetic thin film is made need to be set, or circumferences, manufacturing techniques, or the like of the first magnetic thin film and the second magnetic thin film need to be set, to achieve an objective that a relative magnetic permeability of the first magnetic thin film is less than a relative magnetic permeability of the second magnetic thin film by at least the first threshold.

Optionally, a circumference of the second magnetic thin film in a first plane and the saturated magnetic induction intensity of the second magnetic thin film need to be considered for selection of the relative magnetic permeability of the second magnetic thin film, where a first direction is a direction extending from an opening at one end of the second magnetic thin film to an opening at the other end of the second magnetic thin film, and the first plane is a plane in which a cross section of the second magnetic thin film is located and the first plane is perpendicular to the first direction.

Optionally, a circumference of the first magnetic thin film in a first plane and the saturated magnetic induction intensity of the first magnetic thin film need to be considered for selection of the relative magnetic permeability of the first magnetic thin film, where a first direction is a direction extending from an opening at one end of the first magnetic thin film to an opening at the other end of the first magnetic thin film, and the first plane is a plane in which a cross section of the first magnetic thin film is located and the first plane is perpendicular to the first direction.

As described above, the first magnetic thin film and the second magnetic thin film may be made of different materials. Optionally, a material of which the first magnetic thin film is made is $Ni_{45}Fe_{55}$, and a material of which the second magnetic thin film is made is $Ni_{80}Fe_{20}$. Optionally, a material of which the first magnetic thin film is made is CoZrO, and a material of which the second magnetic thin film is made is CoZrTa or $Ni_{80}Fe_{20}$. Optionally, a material of which the first magnetic thin film is made is CoZrTa, and a material of which the second magnetic thin film is made is $Ni_{80}Fe_{20}$.

It should be noted that, in this application, for that "the at least one electric conductor is located in an inner cavity of an innermost layer of magnetic thin film of the plurality of layers of magnetic thin films", a length direction of each of the at least one electric conductor is the same as a length direction of the innermost layer of magnetic thin film. The length direction of the innermost layer of magnetic thin film is a direction extending from an opening at one end of the innermost layer of magnetic thin film to an opening at the other end of the innermost layer of magnetic thin film.

It should be learned that, each of the at least one electric conductor and an inner wall of the innermost layer of magnetic thin film are insulated from each other. That is, if the electric conductor is disposed on the inner wall of the innermost layer of magnetic thin film, the electric conductor and the inner wall of the innermost layer of magnetic thin film are spaced by an insulation layer. When a quantity of the at least one electric conductor is at least two, the at least two electric conductors are isolated from each other.

Optionally, when a quantity of the at least one electric conductor is at least two, the at least two electric conductors are the same.

Usually, the quantity of the at least one electric conductor is one or two. When the quantity of the at least one electric conductor is two, inductances generated after the two electric conductors are powered on are the same.

It should be noted that, for each of the plurality of layers of magnetic thin films, each layer of magnetic thin film includes a first part and a second part. As shown in FIG. 3, the second part is usually of a planar structure, and the first part may be trapezoidal, arc-shaped (for example, the thin film inductor shown in FIG. 1), or the like. The first part has a first end face and a second end face, the first end face is in contact with a first area of the second part, and the second end face is in contact with a second area of the second part, where the first area of the second part is isolated from the second area of the second part.

It should be learned that, an insulation layer may be disposed between the first end face and the first area of the second part. Certainly, no insulation layer may be alternatively disposed between the first end face and the first area of the second part, that is, the first end face is directly in physical contact with the first area of the second part. Such design has advantages of reducing a magnetic resistance and improving an inductance of the thin film inductor.

Similarly, an insulation layer or no insulation layer may be disposed between the second end face and the second area of the second part. Disposing no insulation layer also has advantages of reducing the magnetic resistance and improving the inductance of the thin film inductor.

In this application, optionally, a thickness $d_1$ of the thin film magnetic core satisfies a condition, 0 micrometers$<d_1 \leq 50$ micrometers. The thickness of the thin film magnetic core is a thickness of a side wall of the thin film magnetic core, and the thickness of the side wall of the thin film magnetic core includes a thickness of each of the plurality of layers of magnetic thin films, and a thickness of an insulation layer located between each two adjacent layers of magnetic thin films. Correspondingly, a thickness $d_2$ of each of the plurality of layers of magnetic thin films satisfies a condition, 0 micrometers$<d_2 \leq 10$ micrometers. Further, a thickness $d_3$ of an insulation layer located between each two adjacent layers of magnetic thin films satisfies a condition, 0 micrometers$<d_3 \leq 2$ micrometers. In this way, the thin film inductor has a relatively small volume, thereby implementing device miniaturization.

It should be noted that, with reference to the foregoing formula $B=NI\mu_0\mu_r/L$, it is easily learned that, when a saturated magnetic induction intensity of a layer of magnetic thin film located in the thin film inductor is determined, and parameters N, I, $\mu_0$, and L are also all determined, a maximum magnetic permeability corresponding to the saturated magnetic induction intensity can be determined. Therefore, by controlling an actual magnetic permeability of the layer of magnetic thin film to be less than the maximum magnetic permeability of the layer of magnetic thin film, an objective that actual magnetic induction intensity of the layer of magnetic thin film is less than the saturated magnetic induction intensity of the layer of magnetic thin film may be achieved.

It is mentioned multiple times above that the magnetic induction intensity of the second magnetic thin film reaches the saturated magnetic induction intensity of the second magnetic thin film, or the magnetic induction intensity of the outer layer of magnetic thin film reaches the saturated magnetic induction intensity of the outer layer of magnetic thin film. A person skilled in the art should learn that, during actual setting, a margin is set between a maximum magnetic induction intensity of the second magnetic thin film and the saturated magnetic induction intensity of the second magnetic thin film, that is, the second magnetic thin film is not magnetically saturated easily, because the inductance of the thin film inductor decreases sharply or is even close to zero if the second magnetic thin film is magnetically saturated. It should be explained that, the maximum magnetic induction intensity of the second magnetic thin film is a maximum magnetic induction intensity that the second magnetic thin film can reach in a normal operating state of the thin film inductor. For setting of the outer layer of magnetic thin film, refer to setting of the second magnetic thin film. Details are not repetitively described again.

Figure 5:
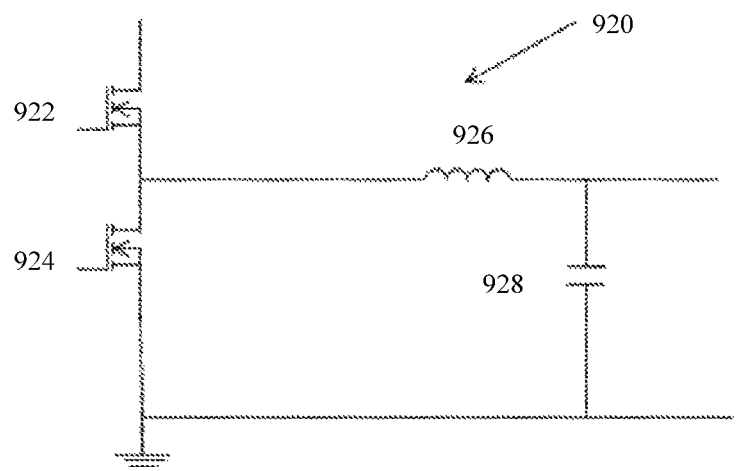
FIG. 5 is a schematic diagram of a power conversion circuit according to this application.

Referring to FIG. 5, FIG. 5 is a circuit diagram of a power conversion circuit 920 according to this application. The power conversion circuit 920 includes a first switching transistor 922, a second switching transistor 924, a capacitor 928, and a thin film inductor 926 according to any one of the foregoing embodiments.

One end of the first switching transistor 922 is connected to one end of the second switching transistor 924, one end of the thin film inductor 926 is connected between the one end of the first switching transistor 922 and the one end of the second switching transistor 924, the other end of the thin film inductor 926 is connected to one end of the capacitor 928, and the other end of the capacitor 928 is connected to the other end of the second switching transistor 924.

When the first switching transistor 922 is switched on and the second switching transistor 924 is switched off, a current that is from an external power supply and that flows through the thin film inductor 926 becomes larger, and when the first switching transistor 922 is switched off and the second switching transistor 924 is switched on, a voltage between two ends of the capacitor 928 is reversely loaded on the thin film inductor 926, and a current flowing through the thin film inductor 926 becomes smaller.

In an embodiment, when the first switching transistor 922 is switched on and the second switching transistor 924 is switched off, the current that is from the external power supply and that flows through the thin film inductor 926 increases, is filtered using the capacitor 928, and then is supplied to a load. When the first switching transistor 922 is switched off and the second switching transistor 924 is switched on, the voltage between the two ends of the capacitor 928 is reversely loaded on the thin film inductor 926, and the current flowing through the thin film inductor 926 begins to decrease, to complete a freewheeling current part in a BUCK conversion circuit.

In the power conversion circuit provided in this application, because the inner layer of magnetic thin film of the used thin film inductor is magnetically saturated earlier than the outer layer of magnetic thin film, the thin film inductor can normally operate. That is, an inductance of the thin film inductor is not abruptly decreased to be close to zero, so that a device in the power conversion circuit in which the thin film inductor is used is not burnt out because of an excessively large current.

Optionally, the other end of the capacitor 928 and the other end of the second switching transistor 924 are both grounded.

Figure 6:
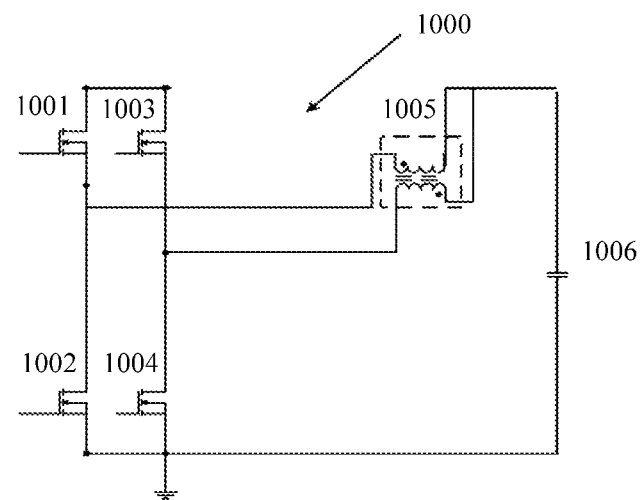
FIG. 6 is a schematic diagram of another power conversion circuit according to this application.

It is easily learned that, the thin film inductor 926 used in the power conversion circuit 920 shown in FIG. 5 is a single-phase thin film inductor, that is, includes only an electric conductor. If the thin film inductor 926 used in the power conversion circuit 920 is two-phase, the power conversion circuit should further include another pair of series-connected switching transistors such as a third switching transistor and a fourth switching transistor, and the another pair of switching transistors are configured to control a value of a current flowing through another electric conductor. For details, refer to FIG. 6. A thin film inductor 1005 used in a power conversion circuit 1000 shown in FIG. 6 is a two-phase thin film inductor, that is, the thin film inductor 1005 includes two electric conductors. Further, the thin film inductor 1005 is also any thin film inductor described in the embodiments about a thin film inductor in this application. Each phase of the power conversion circuit includes an electric conductor and a pair of switching transistors.

As shown in FIG. 6, one end of a first switching transistor 1001 is connected to one end of a second switching transistor 1002, a first end of one phase of the thin film inductor 1005 is connected between the first switching transistor 1001 and the second switching transistor 1002, and a second end of one phase of the thin film inductor 1005 is connected to one end of a capacitor 1006, and one end of a third switching transistor 1003 is connected to one end of a fourth switching transistor 1004, a first end of the other phase of the thin film inductor 1005 is connected between the third switching transistor 1003 and the fourth switching transistor 1004, a second end of the other phase of the thin film inductor 1005 is connected to the one end of the capacitor 1006, and a second end of the capacitor 1006, the other end of the second switching transistor 1002, and the other end of the fourth switching transistor 1004 are all grounded.

In an embodiment, a first phase of the power conversion circuit includes the first switching transistor 1001, the second switching transistor 1002, and the one phase of the thin film inductor 1005. When the first switching transistor 1001 begins to be switched on and the second switching transistor 1002 is switched off, a direct current flows through the one phase of the thin film inductor 1005 connected to the first switching transistor 1001, and a current of the thin film inductor 1005 begins to increase, is filtered using the capacitor 1006, and then supplies power to a load R. When the first switching transistor 1001 is switched off and the second switching transistor 1002 begins to be switched on, a voltage on the capacitor 1006 is reversely applied to the thin film inductor 1005, and the current of the thin film inductor 1005 begins to decrease, to complete a freewheeling current part in a BUCK conversion circuit.

Likewise, a second phase of the power conversion circuit includes the third switching transistor 1003, the fourth switching transistor 1004, and the other phase of the thin film inductor 1005. When the third switching transistor 1003 begins to be switched on and the fourth switching transistor 1004 is switched off, a direct current flows through the one phase of the thin film inductor 1005 connected to the third switching transistor 1003, and a current of the thin film inductor 1005 begins to increase, is filtered using the capacitor 1006, and then supplies power to the load R. When the third switching transistor 1003 is switched off and the fourth switching transistor 1004 begins to be switched on, a voltage on the capacitor 1006 is reversely applied to the thin film inductor 1005, and the current of the thin film inductor 1005 begins to decrease, to complete a freewheeling current part in a BUCK conversion circuit.

In this embodiment, the power conversion circuit includes switching transistors Q1, Q2, Q3, and Q4, and a thin film inductor unit L1. In an embodiment, based on a requirement of the load on a current, one or more power conversion circuits described in this embodiment may be used to supply power to the load in a parallel-connected manner.

Figure 7:
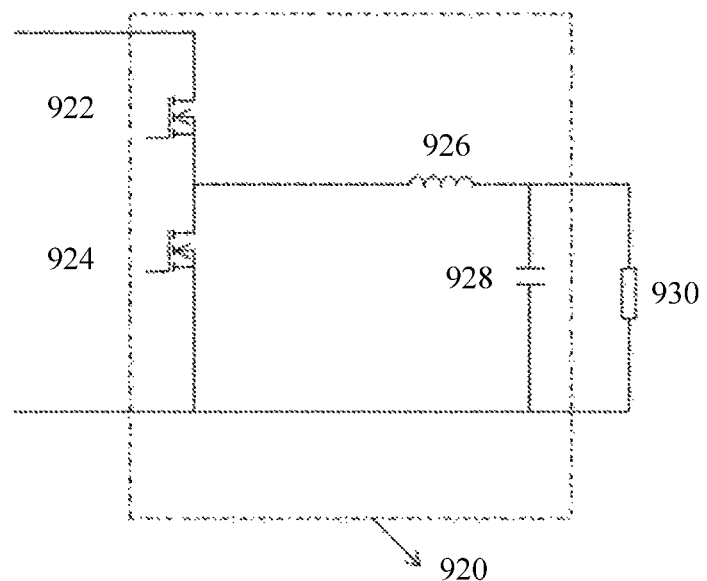
FIG. 7 is a diagram of an internal circuit of a chip to which a power conversion circuit shown in FIG. 5 is applied according to this application.

Further, referring to FIG. 7, FIG. 7 is a diagram of a circuit in a chip. The circuit in the chip includes as a power conversion circuit 920 shown in FIG. 5 and a load 930. The foregoing description about the power conversion circuit 920 shown in FIG. 5 continues to be used. In the circuit in the chip shown in FIG. 7, one end of the load 930 is connected to the other end of the thin film inductor 926, and the other end of the load 930 is connected to the other end of the capacitor 928. The power conversion circuit 920 is configured to receive a current from an external power supply, convert the current, and then supply the converted current to the load 930.

Figure 8:
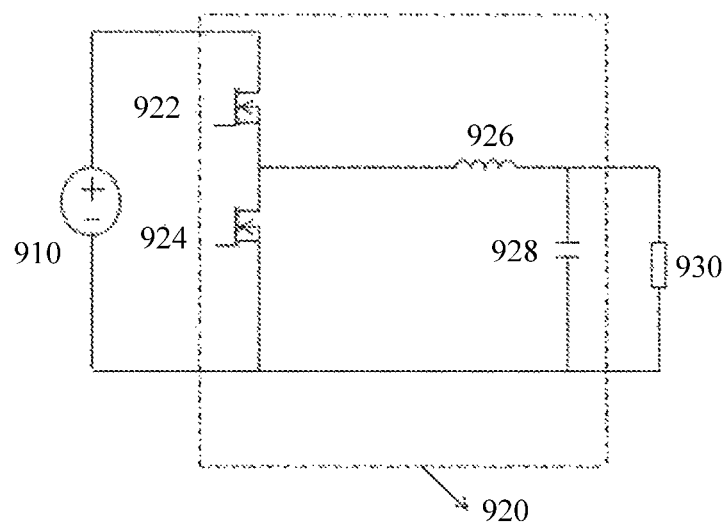
FIG. 8 is a diagram of another circuit to which a power conversion circuit shown in FIG. 5 is applied according to this application.

Furthermore, referring to FIG. 8, compared with the circuit diagram shown in FIG. 7, in a circuit diagram shown in FIG. 8, a direct current power supply 910 is further included. The foregoing description about the power conversion circuit shown in FIG. 5 continues to be used. In the circuit diagram shown in FIG. 8, the other end of the first switching transistor 922 is connected to a positive electrode of the direct current power supply 910, and the other end of the second switching transistor 924 is connected to a negative electrode of the direct current power supply 910. In an embodiment, the power conversion circuit 920 is configured to receive a current from the direct current power supply 910, convert the current, and then supply the converted current to the load 930.

In some cases, to reduce an eddy current loss of a thin film magnetic core, the thin film magnetic core usually includes a plurality of layers of magnetic thin films, that is, the thin film magnetic core includes at least two layers of magnetic thin films, and the layers of magnetic thin films are made of a same material (it may be understood that the layers of magnetic thin films have a same attribute). Using any two magnetic thin films (a magnetic thin film 111 and a magnetic thin film 112) of a magnetic copper-clad thin film inductor shown in FIG. 10 is an example.

Figure 9:
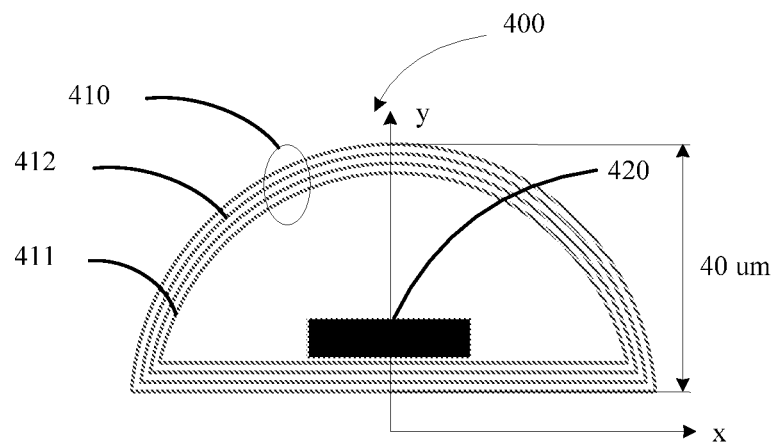
FIG. 9 is a schematic structural diagram of a magnetic copper-clad thin film inductor.

First, with reference to FIG. 9, a relationship between parameters is described using the following formulas, $R=L/\mu_0\mu_r A$, where R is a magnetic resistance of a magnetic thin film, L is an equivalent length of a flux loop generated by the magnetic thin film and a powered-on conductive winding on a cross section shown in FIG. 9, $\mu_0$ is a magnetic permeability of the magnetic thin film in vacuum, $\mu_r$ is a magnetic permeability of the magnetic thin film in a non-conductive magnetic medium, and A is a cross-sectional area of the magnetic thin film along a direction perpendicular to a flux circulation direction, $\phi=NI/R$, where $\phi$ is a flux generated by the magnetic thin film and the powered-on conductive winding, N is a quantity of turns of a coil of the conductive winding, and I is a current flowing through the conductive winding, and $B=\phi/A$, where B is a magnetic induction intensity generated by the conductive winding and the magnetic thin film, and it may be learned based on the foregoing three formulas, $B=NI\mu_0\mu_r/L$, that is, when parameters N, I, $\mu_0$, and $\mu_r$ are constant, the magnetic induction intensity B is inversely proportional to the length L of the magnetic thin film.

FIG. 9 is a schematic structural diagram of a magnetic copper-clad thin film inductor. As shown in FIG. 9, a magnetic thin film 411 is the inner layer of magnetic thin film in the thin film inductor in the background, and a magnetic thin film 412 is the outer layer of magnetic thin film in the thin film inductor in the background. On a shown cross section (that is, a plane in which a flux loop is located), compared with the magnetic thin film 412, a circumference of the magnetic thin film 411 is shorter, and correspondingly, an equivalent path in the magnetic thin film 411 is shorter. It may be learned based on a formula $B=NI\mu_0\mu_r/L$ that, a magnetic induction intensity of the magnetic thin film 411 is larger, and reaches a saturation state very easily.

Figure 10:
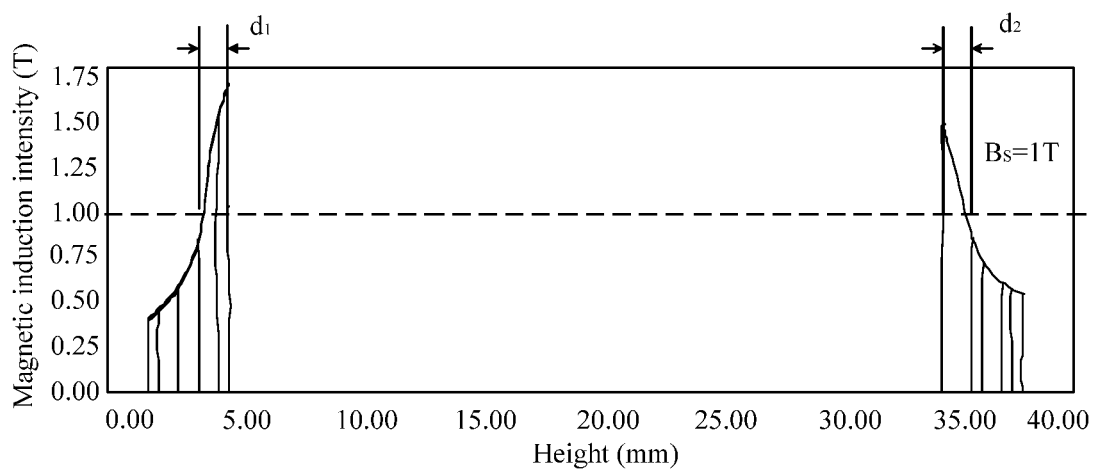
FIG. 10 is a distribution diagram of a magnetic induction intensity of a magnetic copper-clad inductor made of a material of $Ni_{80}Fe_{20}$.

FIG. 10 is a distribution diagram of a magnetic induction intensity of a magnetic copper-clad thin film inductor made of a material of $Ni_{80}Fe_{20}$. A latitudinal axis in a horizontal direction shown in FIG. 10 is a y-axis direction shown in FIG. 9, and a coordinate range corresponding to the latitudinal axis is an area of 40 μm of the thin film inductor in the y-axis direction shown in FIG. 9. A longitudinal axis in a vertical direction shown in FIG. 10 is used to indicate a magnetic induction intensity of a magnetic thin film in the thin film inductor. A maximum magnetic induction intensity $B_S$ of $Ni_{80}Fe_{20}$ is 1 T. It may be learned from FIG. 10 that, a magnetic induction intensity of magnetic thin films in a range of an area $d_1$ and an area $d_2$ (that is, magnetic thin films that are close to a conductive winding and that include the magnetic thin film 412) is greater than or equal to the maximum magnetic induction intensity of the material, to reach a saturation state. Consequently, a magnetic permeability is close to zero. As a result, an inductance decreases sharply, a current in a power conversion circuit increases sharply, and a device is burnt out even in a severe case.

Therefore, a thin film magnetic core provided in an embodiment of this application can be applied to a thin film inductor, to resolve the problem that an inner layer of magnetic thin film is easily saturated.

Figure 11:
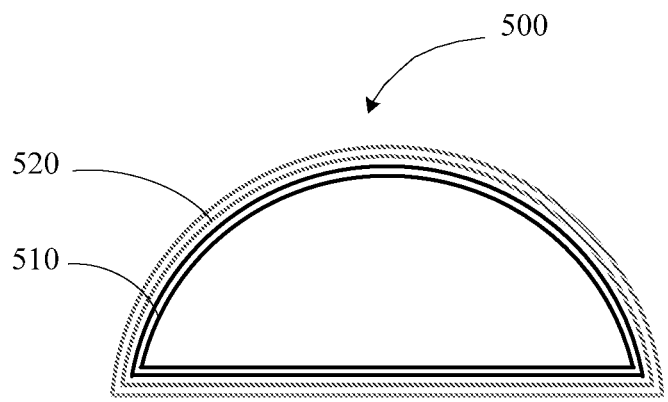
FIG. 11 is a schematic structural diagram of a thin film magnetic core according to an embodiment of this application.
Figure 12:
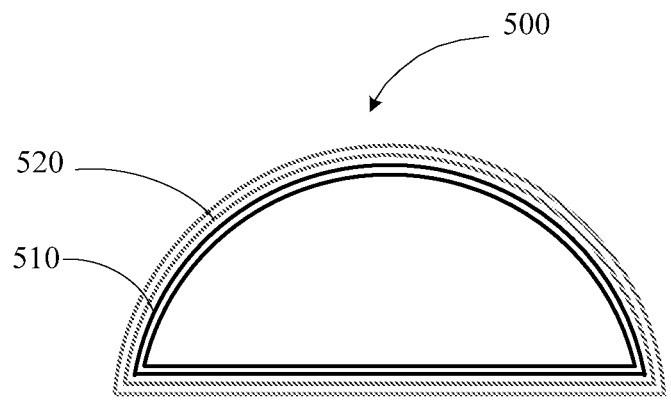
FIG. 12 is a schematic structural diagram of a thin film magnetic core according to another embodiment of this application.
Figure 13:
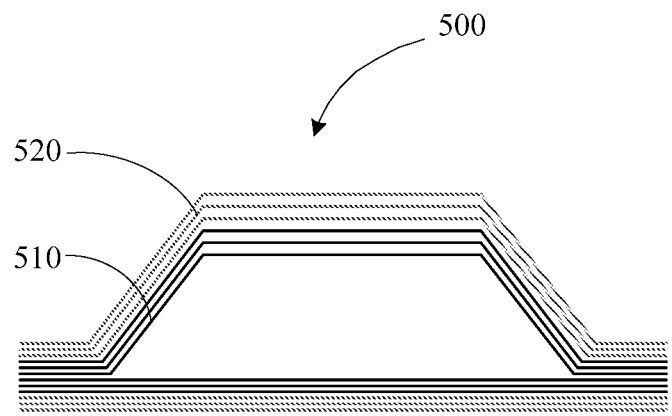
FIG. 13 is a schematic structural diagram of a thin film magnetic core according to another embodiment of this application.

Each of FIG. 11 to FIG. 13 is a schematic structural diagram of a thin film magnetic core according to an embodiment of this application.

A structure of a thin film magnetic core according to an embodiment of this application is described in detail below with reference to FIG. 11 to FIG. 13.

As shown in FIG. 11, a thin film magnetic core 500 is formed into a cavity structure, each of two ends of the cavity structure is of an opening shape, the thin film magnetic core 500 includes a plurality of layers of magnetic thin films, and each two adjacent layers of magnetic thin films are spaced by an insulation layer, and the plurality of layers of magnetic thin films include a first layer of magnetic thin film 510 and a second layer of magnetic thin film 520, and the first layer of magnetic thin film 510 is nested in the second layer of magnetic thin film 520, where a saturated magnetic induction intensity of the first layer of magnetic thin film 510 is greater than a saturated magnetic induction intensity of the second layer of magnetic thin film 520, a difference between the saturated magnetic induction intensity of the first layer of magnetic thin film 510 and the saturated magnetic induction intensity of the second layer of magnetic thin film 520 is greater than a first threshold, and when a magnetic permeability of the first layer of magnetic thin film 510 is greater than a magnetic permeability of the second layer of magnetic thin film 520, a difference between the magnetic permeability of the first layer of magnetic thin film 510 and the magnetic permeability of the second layer of magnetic thin film 520 is less than a second threshold, so that a magnetic induction intensity of the first layer of magnetic thin film 510 is less than the saturated magnetic induction intensity of the first layer of magnetic thin film 510, or a magnetic permeability of the first layer of magnetic thin film 510 is less than a magnetic permeability of the second layer of magnetic thin film 520, a difference between the magnetic permeability of the first layer of magnetic thin film 510 and the magnetic permeability of the second layer of magnetic thin film 520 is greater than a third threshold, and when a saturated magnetic induction intensity of the first layer of magnetic thin film 510 is less than a saturated magnetic induction intensity of the second layer of magnetic thin film 520, a difference between the saturated magnetic induction intensity of the first layer of magnetic thin film 510 and the saturated magnetic induction intensity of the second layer of magnetic thin film 520 is less than a fourth threshold, so that a magnetic induction intensity of the first layer of magnetic thin film 510 is less than the saturated magnetic induction intensity of the first layer of magnetic thin film 510.

The cavity structure formed in the thin film magnetic core 500 has two end portions, the two end portions are both of an opening shape, the cavity structure has only a side wall, the side wall is the thin film magnetic core 500, and a thickness of the side wall is a thickness of the thin film magnetic core 500.

It should be understood that, the thin film magnetic core 500 includes a plurality of layers of magnetic thin films including a first layer of magnetic thin film 510 and a second layer of magnetic thin film 520, and an insulation layer is deposited between each two adjacent layers of magnetic thin films, and a material of the insulation layer may be a coating made of silicon dioxide, silicon nitride, or another insulation organic material, to implement isolation between each two adjacent layers of magnetic thin films.

In this embodiment of in this application, the first layer of magnetic thin film 510 and the second layer of magnetic thin film 520 may be any two layers of magnetic thin films of the plurality of layers of magnetic thin films in the thin film magnetic core 500 (that is, all magnetic thin films satisfy the foregoing characteristic), or the first layer of magnetic thin film 510 and the second layer of magnetic thin film 520 may be two particular layers of magnetic thin films of the plurality of layers of magnetic thin films included in the thin film magnetic core 500 (that is, at least two layers of magnetic thin films satisfy the foregoing condition). The two layers of magnetic thin films shown in FIG. 11 may be spaced by another magnetic thin film, or the two layers of magnetic thin films shown in FIG. 12 may be not spaced by another magnetic thin film, but spaced by only an insulation layer.

It should be further noted that, a location relationship between the first layer of magnetic thin film and the second layer of magnetic thin film in FIG. 11 and FIG. 12 is described only as an example, and should not constitute any limitation on this embodiment of the present disclosure, provided that the first layer of magnetic thin film is nested in the second layer of magnetic thin film (that is, the first layer of magnetic thin film is located at an inner side of the second layer of magnetic thin film), and the saturated magnetic induction intensity or the magnetic permeability of the first layer of magnetic thin film satisfies the foregoing condition.

A thin film magnetic core according to an embodiment of this application is described in detail below using the two layers of magnetic thin films (that is, the first layer of magnetic thin film 510 and the second layer of magnetic thin film 520) in the thin film magnetic core shown in FIG. 11 as an example.

In the thin film magnetic core 500 of this embodiment of this application, to alleviate the problem that a magnetic induction intensity of an inner layer of magnetic thin film is easily saturated, two parameters (that is, a saturated magnetic induction intensity and a magnetic permeability of the magnetic thin film) are changed.

First, two parameters in this embodiment of this application are described. A saturated magnetic induction intensity of a magnetic thin film is related to only an attribute of a magnetic material, and is an inherent attribute of the magnetic material. Therefore, when saturated magnetic induction intensities of magnetic thin films are different, materials of the magnetic thin films are inevitably different. A magnetic permeability of a magnetic thin film is not only related to an attribute of a magnetic material, but also related to an external factor of the magnetic material such as a manufacturing technique. Therefore, when magnetic permeabilities of magnetic thin films are different, materials of the magnetic thin films may be the same or different.

Below, for the first layer of magnetic thin film 510 and the second layer of magnetic thin film 520, conditions that the foregoing parameters need to satisfy are described in detail.

Parameter 1 (Saturated Magnetic Induction Intensity)

A saturated magnetic induction intensity of the first layer of magnetic thin film 510 is greater than a saturated magnetic induction intensity of the second layer of magnetic thin film 520, a difference between the saturated magnetic induction intensity of the first layer of magnetic thin film 510 and the saturated magnetic induction intensity of the second layer of magnetic thin film 520 is greater than a first threshold, and when a magnetic permeability of the first layer of magnetic thin film 510 is greater than a magnetic permeability of the second layer of magnetic thin film 520, a difference between the magnetic permeability of the first layer of magnetic thin film 510 and the magnetic permeability of the second layer of magnetic thin film 520 is less than a second threshold, so that a magnetic induction intensity of the first layer of magnetic thin film 510 is less than the saturated magnetic induction intensity of the first layer of magnetic thin film 510.

As described above, when saturated magnetic induction intensities of the foregoing two layers of magnetic thin films are different, materials of the foregoing two layers of magnetic thin films are inevitably different. Moreover, after a structure of the thin film magnetic core 500 is determined, a circumference of each layer of magnetic thin film on a plane in which a cross section of the cavity structure along a direction perpendicular to a first direction is located (for convenience of understanding and distinguishing, the plane is marked as a first plane) is determined, and the first direction is a direction extending from an opening at one end of the cavity structure to an opening at the other end, that is, the first plane is a plane in which a cross section shown in FIG. 11 is located.

The first layer of magnetic thin film 510 is located at an inner side of the second layer of magnetic thin film 520. Therefore, a circumference of the first layer of magnetic thin film 510 in the first plane is less than a circumference of the second layer of magnetic thin film 520 in the first plane. Therefore, when a magnetic material is selected, a saturated magnetic induction intensity is used as a selection standard, and a magnetic material whose saturated magnetic induction intensity is relatively large is selected for the first layer of magnetic thin film 510. A magnetic material whose saturated magnetic induction intensity is relatively small is selected for the second layer of magnetic thin film 520. Moreover, when an inductance, a circumference of a magnetic thin film, and a saturated magnetic induction intensity of a magnetic material are determined, an appropriate data range may be obtained by performing a related experiment, so that a difference between the saturated magnetic induction intensity of the first layer of magnetic thin film 510 and the saturated magnetic induction intensity of the second layer of magnetic thin film 520 is less than the first threshold.

Under a condition of the first threshold, because a magnetic permeability of a magnetic thin film is directly proportional to a magnetic induction intensity of the magnetic thin film, when the magnetic permeability of the first layer of magnetic thin film 510 is greater than the magnetic permeability of the second layer of magnetic thin film 520, a magnetic induction intensity generated by the first layer of magnetic thin film 510 is greater than a magnetic induction intensity of the second layer of magnetic thin film 520. In this case, the difference between the magnetic permeability of the first layer of magnetic thin film 510 and the magnetic permeability of the second layer of magnetic thin film 520 needs to be less than the second threshold in this way, the magnetic induction intensity of the first layer of magnetic thin film 510 can be less than the saturated magnetic induction intensity of the first layer of magnetic thin film 510. Likewise, when an inductance of the thin film magnetic core, a circumference of a magnetic thin film, and a saturated magnetic induction intensity of a magnetic material are determined, the second threshold may be determined by performing a related experiment, to obtain an appropriate difference range.

Parameter 2 (Magnetic Permeability)

A magnetic permeability of the first layer of magnetic thin film is less than a magnetic permeability of the second layer of magnetic thin film, a difference between the magnetic permeability of the first layer of magnetic thin film and the magnetic permeability of the second layer of magnetic thin film is greater than a third threshold, and when a saturated magnetic induction intensity of the first layer of magnetic thin film is less than a saturated magnetic induction intensity of the second layer of magnetic thin film, a difference between the saturated magnetic induction intensity of the first layer of magnetic thin film and the saturated magnetic induction intensity of the second layer of magnetic thin film is less than a fourth threshold, so that a magnetic induction intensity of the first layer of magnetic thin film is less than the saturated magnetic induction intensity of the first layer of magnetic thin film.

In this way, the magnetic permeability of the first layer of magnetic thin film 510 is less than the magnetic permeability of the second layer of magnetic thin film 520, so that the magnetic induction intensity generated by the first layer of magnetic thin film 510 is less than a magnetic induction intensity of the second layer of magnetic thin film 520. Because a magnetic permeability of a magnetic material is not only related to a material attribute, but also related to a specific actual technique, a material of the first layer of magnetic thin film 510 and a material of the second layer of magnetic thin film 520 may be the same (that is, a situation A), or may be different (that is, a situation B). The foregoing two situations are separately described below.

Situation A

The material of the first layer of magnetic thin film 510 is the same as that of the second layer of magnetic thin film 520. That is, the saturated magnetic induction intensity of the first layer of magnetic thin film 510 is the same as the saturated magnetic induction intensity of the second layer of magnetic thin film 520, and a difference between the magnetic permeability of the first layer of magnetic thin film 510 and the magnetic permeability of the second layer of magnetic thin film 520 may be obtained by performing related calculation. In brief, a magnetic permeability of each layer of magnetic thin film may be calculated using a specific formula (specific determination of a magnetic permeability is described in detail subsequently). Test is performed using an experiment, and under conditions that the magnetic induction intensity of the first layer of magnetic thin film 510 is less than the saturated magnetic induction intensity and the inductance is appropriate, a plurality of sets of data are obtained, thereby determining the third threshold.

Situation B

The material of the first layer of magnetic thin film 510 is different from that of the second layer of magnetic thin film 520. The saturated magnetic induction intensity of the first layer of magnetic thin film 510 is different from the saturated magnetic induction intensity of the second layer of magnetic thin film 520, that is, the saturated magnetic induction intensity of the first layer of magnetic thin film 510 is greater than or less than the saturated magnetic induction intensity of the second layer of magnetic thin film 520.

When the saturated magnetic induction intensity of the first layer of magnetic thin film 510 is greater than the saturated magnetic induction intensity of the second layer of magnetic thin film 520, the third threshold may be likewise obtained in a calculation and experiment manner.

When the saturated magnetic induction intensity of the first layer of magnetic thin film 510 is less than the saturated magnetic induction intensity of the second layer of magnetic thin film 520, not only the third threshold needs to be determined, but also a range of the difference between the saturated magnetic induction intensity of the first layer of magnetic thin film 510 and the saturated magnetic induction intensity of the second layer of magnetic thin film 520, that is, the fourth threshold needs to be determined. Because a magnetic permeability of a magnetic thin film is directly proportional to a magnetic induction intensity of the magnetic thin film, when the saturated magnetic induction intensity of the first layer of magnetic thin film 510 is less than the saturated magnetic induction intensity of the second layer of magnetic thin film 520, the magnetic induction intensity generated by the first layer of magnetic thin film 510 is less than the magnetic induction intensity of the second layer of magnetic thin film 520. In this case, the difference between the saturated magnetic induction intensity of the first layer of magnetic thin film 510 and the saturated magnetic induction intensity of the second layer of magnetic thin film 520 needs to be less than the fourth threshold, and then the magnetic induction intensity of the first layer of magnetic thin film 510 can be less than the saturated magnetic induction intensity of the first layer of magnetic thin film 510.

It should be noted that, the location relationship between the first layer of magnetic thin film 510 and the second layer of magnetic thin film 520 in FIG. 11 and FIG. 12 is described only as an example, and should not constitute any limitation on this embodiment of the present disclosure. Moreover, the first layer of magnetic thin film 510 may be an inner layer of magnetic thin film, and the first layer of magnetic thin film 510 may be a magnetic thin film closest to at least one electric conductor (that is, conductive winding) placed in the cavity structure, or may be not a magnetic thin film closest to a conductive winding, provided that the first layer of magnetic thin film 510 is nested in the second layer of magnetic thin film 520 (that is, the first layer of magnetic thin film 510 is located at an inner side of the second layer of magnetic thin film 520), and the saturated magnetic induction intensity or the magnetic permeability of the first layer of magnetic thin film 510 satisfies the foregoing condition.

By way of example, and not limitation, the thin film magnetic core not only may be of shapes shown in FIG. 11 and FIG. 12, but also may be of another shape, provided that the thin film magnetic core can be formed into the cavity structure described above, so that the thin film magnetic core has a cavity in which at least one electric conductor can be placed.

For example, the shape of the thin film magnetic core may alternatively be shown in FIG. 13. An upper thin film magnetic core in the thin film magnetic core 500 is similar to a trapezoid, and a lower thin film magnetic core is connected to the upper thin film magnetic core, to form an enclosed magnetic copper-clad thin film magnetic core.

For another example, the shape of the thin film magnetic core may alternatively be a rectangle, an ellipse, or the like (not shown), and this embodiment of this application is not limited thereto.

Therefore, in the thin film magnetic core provided in this embodiment of this application, the saturated magnetic induction intensity of the first layer of magnetic thin film (that is, the inner layer of magnetic thin film) is greater than the saturated magnetic induction intensity of the second layer of magnetic thin film (that is, the outer layer of magnetic thin film), so that the magnetic induction intensity that the first layer of magnetic thin film can accommodate can be effectively increased, or the magnetic permeability of the first layer of magnetic thin film is less than the magnetic permeability of the second layer of magnetic thin film, so that the magnetic induction intensity of the first layer of magnetic thin film can be effectively reduced. Therefore, both may effectively reduce a possibility that the magnetic induction intensity of the first layer of magnetic thin film is easily saturated. Moreover, compared with the problem of a relatively small inductance caused by only use of the magnetic thin film of low magnetic permeability performance to reduce the magnetic induction intensity of the first layer of magnetic thin film, this embodiment of this application can also effectively ensure an inductance of the thin film inductor.

Optionally, a material of the first layer of magnetic thin film 510 is different from a material of the second layer of magnetic thin film 520. That is, the first layer of magnetic thin film 510 and the second layer of magnetic thin film 520 are made of different materials.

Optionally, a thickness of the first layer of magnetic thin film 510 is greater than a thickness of the second layer of magnetic thin film 520.

In an embodiment, when the material of the first layer of magnetic thin film 510 is the same as the material of the second layer of magnetic thin film 520, the magnetic permeability of the first layer of magnetic thin film 510 may be different from that of the second layer of magnetic thin film 520 by performing technical manufacturing, that is, the magnetic permeability of the first layer of magnetic thin film 510 is less than the magnetic permeability of the second layer of magnetic thin film 520.

For example, a magnetic permeability is changed by changing performance such as a sputtering pressure, a power, or a temperature.

For another example, a magnetic permeability is changed by changing a thickness of each layer of magnetic thin film.

Further, a thickness of a magnetic thin film is reversely proportional to a magnetic permeability. A larger thickness of the magnetic thin film indicates a smaller magnetic permeability of the magnetic thin film, and a smaller thickness of the magnetic thin film indicates a larger magnetic permeability of the magnetic thin film. Therefore, the thickness of the first layer of magnetic thin film 510 is greater than the thickness of the second layer of magnetic thin film 520, so that the magnetic permeability of the first layer of magnetic thin film 510 is less than the magnetic permeability of the second layer of magnetic thin film.

Just as described above, the first layer of magnetic thin film 510 and the second layer of magnetic thin film 520 are any two magnetic thin films of a plurality of magnetic thin films in the thin film magnetic core. The thickness of the first layer of magnetic thin film 510 may be increased and the thickness of the second layer of magnetic thin film 520 may be reduced without changing an entire thickness of the thin film magnetic core (that is, a total thickness of the plurality of magnetic thin films).

It should be understood that, changing a magnetic permeability by changing the thickness of the first layer of magnetic thin film 510 and the thickness of the second layer of magnetic thin film 520 is not only applicable to a situation in which materials of different magnetic thin films are the same, but also applicable to a situation in which materials of different magnetic thin films are different. This embodiment of this application is not limited thereto.

Optionally, a difference between the thickness of the first layer of magnetic thin film 510 and the thickness of the second layer of magnetic thin film 520 is less than a fifth threshold, and the fifth threshold is three times the thickness of the second layer of magnetic thin film 520.

It may be understood that, the fifth threshold is a relationship between a thickness of a magnetic thin film whose circumference is maximum and a thickness of a magnetic thin film whose circumference is minimum, and a specific value of the fifth threshold may be determined based on a size of a structure of the thin film magnetic core, an inductance required by a thin film inductor including the thin film magnetic core, and the like.

Optionally, the magnetic permeability of the first layer of magnetic thin film 510 is determined based on a circumference of the first layer of magnetic thin film 510 in a first plane and the saturated magnetic induction intensity of the first layer of magnetic thin film 510, the magnetic permeability of the second layer of magnetic thin film 520 is determined based on a circumference of the second layer of magnetic thin film 520 in the first plane and the saturated magnetic induction intensity of the second layer of magnetic thin film 520, the first plane is a plane in which a cross section of the cavity structure is located and the first plane is perpendicular to a first direction, and the first direction is a direction extending from an opening at one end of the cavity structure to an opening at the other end.

When an inductance of the thin film magnetic core, a circumference of a magnetic thin film, and a saturated magnetic induction intensity of a magnetic material are determined, a magnetic permeability of each layer of magnetic thin film may be obtained by performing related calculation.

In an embodiment, as described in the foregoing formula $B=NI\mu_0\mu_r/L$, that is, when parameters N, I, $\mu_0$, and B (a value of B is the saturated magnetic induction intensity of the magnetic material) are determined, $\mu_r$, that is, a maximum magnetic permeability corresponding to a saturated magnetic induction intensity of the magnetic thin film is obtained through calculation, and an actual magnetic permeability of the magnetic thin film is made less than the maximum magnetic permeability in a technical manner. In this way, each layer of magnetic thin film has no problem that the magnetic induction intensity is easily saturated.

Optionally, the saturated magnetic induction intensity of the first layer of magnetic thin film 510 and the saturated magnetic induction intensity of the second layer of magnetic thin film 520 are determined based on a relationship between the circumference of the first layer of magnetic thin film 510 in the first plane and a circumference of the second layer of magnetic thin film 520 in a second plane, or the magnetic permeability of the first layer of magnetic thin film 510 and the magnetic permeability of the second layer of magnetic thin film 520 are determined based on the circumference of the first layer of magnetic thin film 510 in the first plane and a circumference of the second layer of magnetic thin film 520 in a second plane.

Further, as described above, when other conditions are constant, the problem that the inner layer of magnetic thin film easily generates a saturated magnetic induction intensity is caused when a circumference of the inner layer of magnetic thin film in the first plane is shorter than a circumference of the outer layer of magnetic thin film in the first plane. Therefore, the saturated magnetic induction intensity of the first layer of magnetic thin film 510 and the saturated magnetic induction intensity of the second layer of magnetic thin film 520, or the magnetic permeability of the first layer of magnetic thin film 510 and the magnetic permeability of the second layer of magnetic thin film 520 may be determined based on a circumference relationship between the two layers of magnetic thin films.

For example, if circumferences of the two layers of magnetic thin films in the first plane differ largely, magnetic thin films whose saturated magnetic induction intensities differ largely may be selected as the first layer of magnetic thin film 510 and the second layer of magnetic thin film 520, or magnetic thin films whose magnetic permeabilities differ largely may be selected as the first layer of magnetic thin film 510 and the second layer of magnetic thin film 520.

For another example, if circumferences of the two layers of magnetic thin films in the first plane differ slightly, magnetic thin films whose saturated magnetic induction intensities differ slightly may be selected as the first layer of magnetic thin film 510 and the second layer of magnetic thin film 520, or magnetic thin films whose magnetic permeabilities differ slightly may be selected as the first layer of magnetic thin film 510 and the second layer of magnetic thin film 520.

By way of example, and not limitation, the foregoing method for determining the saturated magnetic induction intensity of the first layer of magnetic thin film 510 and the saturated magnetic induction intensity of the second layer of magnetic thin film 520, and the foregoing method for determining the magnetic permeability of the first layer of magnetic thin film 510 and the magnetic permeability of the second layer of magnetic thin film 520 not only may be determined based on a relationship between circumferences of the two layers of magnetic thin films on a plane in which a flux loop is located, but also may be determined jointly based on other parameters such as an inductance required by a thin film inductor including the thin film magnetic core, and an average magnetic induction intensity required by the thin film inductor. This embodiment of this application is not limited thereto, and this should not constitute any limitation on this embodiment of this application.

As described above, the first layer of magnetic thin film 510 and the second layer of magnetic thin film 520 may be any two layers of the plurality of layers of magnetic thin films in the thin film magnetic core. When all magnetic thin films satisfy the foregoing condition, it is equivalent to that saturated magnetic induction intensities or magnetic permeabilities of all magnetic thin films in the thin film magnetic core are gradually changed along a thickness direction from inside to outside, that is, the saturated magnetic induction intensities of the plurality of layers of magnetic thin films are gradually decreased from inside to outside, or the magnetic permeabilities of the plurality of layers of magnetic thin films are gradually increased from inside to outside.

The first layer of magnetic thin film 510 and the second layer of magnetic thin film 520 may be two particular layers of magnetic thin films of the plurality of layers of magnetic thin films. When the two layers of magnetic thin films are spaced by another magnetic thin film (for convenience of understanding and description, the another magnetic thin film is marked as a fifth magnetic thin film), a magnetic permeability of the fifth magnetic thin film may be the same as a magnetic permeability of either of the two layers of magnetic thin films, to reduce technical complexity and costs.

Optionally, the plurality of layers of magnetic thin films further include a third layer of magnetic thin film, the third layer of magnetic thin film is nested in the second layer of magnetic thin film, and the third layer of magnetic thin film is nested in the first layer of magnetic thin film, or the first layer of magnetic thin film is nested in the third layer of magnetic thin film, where a saturated magnetic induction intensity of the third layer of magnetic thin film is the same as the saturated magnetic induction intensity of the first layer of magnetic thin film, or a magnetic permeability of the third layer of magnetic thin film is the same as the magnetic permeability of the first layer of magnetic thin film, both a circumference of the third layer of magnetic thin film in a first plane and a circumference of the first layer of magnetic thin film in the first plane fall within a first circumference range, the first plane is a plane in which a cross section of the cavity structure is located and the first plane is perpendicular to a first direction, and the first direction is a direction extending from an opening at one end of the cavity structure to an opening at the other end, and the plurality of layers of magnetic thin films further include a fourth layer of magnetic thin film, the second layer of magnetic thin film is nested in the fourth layer of magnetic thin film, or the fourth layer of magnetic thin film is nested in the second layer of magnetic thin film, and the third layer of magnetic thin film and the first layer of magnetic thin film are both nested in the fourth layer of magnetic thin film, where a saturated magnetic induction intensity of the fourth layer of magnetic thin film is the same as the saturated magnetic induction intensity of the second layer of magnetic thin film, or a magnetic permeability of the fourth layer of magnetic thin film is the same as the magnetic permeability of the second layer of magnetic thin film, and both a circumference of the fourth layer of magnetic thin film in the first plane and a circumference of the second layer of magnetic thin film in the first plane fall within a second circumference range, and a lower limit value of the second circumference range is greater than an upper limit value of the first circumference range.

In an embodiment, the plurality of layers of magnetic thin films in the thin film magnetic core 500 may be divided into a plurality of groups based on a circumference of each layer of magnetic thin film in the first plane, saturated magnetic induction intensities or magnetic permeabilities of magnetic thin films in a same group are the same, saturated magnetic induction intensities or magnetic permeabilities of magnetic thin films in different groups are different, and grouping is determined based on a circumference range.

Therefore, in the thin film magnetic core in this embodiment of this application, the plurality of layers of magnetic thin films in the thin film magnetic core belong to at least two magnetic thin film groups, magnetic permeabilities or saturated magnetic induction intensities in each magnetic thin film group are the same, and magnetic permeabilities of a group of inner layers of magnetic thin films are less than magnetic permeabilities of a group of outer layers of magnetic thin films, or saturated magnetic induction intensities of a group of inner layers of magnetic thin films are greater than saturated magnetic induction intensities of a group of outer layers of magnetic thin films, so that not only a possibility that a magnetic induction intensity of an inner layer of magnetic thin film is easily saturated, but also complexity of a manufacturing process can be reduced, thereby cutting costs.

Optionally, a thickness $d_1$ of the thin film magnetic core satisfies a condition, 0 micrometers<$d_1$≤5 micrometers.

Optionally, a thickness $d_2$ of each of the plurality of layers of magnetic thin films satisfies a condition, 0 micrometers<$d_2$≤1 micrometers.

Optionally, a thickness $d_3$ of each insulation layer satisfies a condition, 0 micrometers<$d_3$≤20 micrometers.

In this way, the thin film magnetic core has a relatively small volume, and may be better applied to a battery chip.

Figure 14:
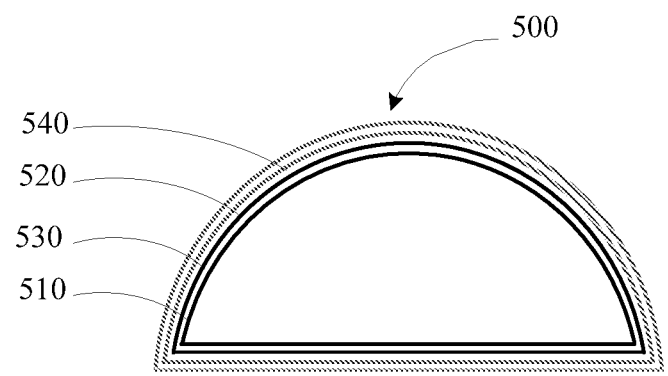
FIG. 14 is a schematic structural diagram of a thin film magnetic core according to another embodiment of this application.

An embodiment of this application is described with reference to FIG. 14 below using a first layer of magnetic thin film 510, a second layer of magnetic thin film 520, a third layer of magnetic thin film 530, and a fourth layer of magnetic thin film 540 as an example.

As described above, a circumference of the third layer of magnetic thin film 530 in the first plane and a circumference of the first layer of magnetic thin film 510 in the first plane fall within a first circumference range, that is, the first layer of magnetic thin film 510 and the third layer of magnetic thin film 530 are located in a group (for convenience of understanding and description, the group is marked as a first magnetic thin film group), and have a same saturated magnetic induction intensity or magnetic permeability. From a perspective of location relationship, the first layer of magnetic thin film 510 and the third layer of magnetic thin film 530 are both located at an inner side of the second layer of magnetic thin film 520 (that is, the first layer of magnetic thin film 510 is nested in the second layer of magnetic thin film 520, and the third layer of magnetic thin film 530 is nested in the second layer of magnetic thin film 520), the first layer of magnetic thin film 510 may be located at an inner side of the third layer of magnetic thin film 530 (that is, the first layer of magnetic thin film 510 is nested in the third layer of magnetic thin film 530), or the third layer of magnetic thin film 530 may be located at an inner side of the first layer of magnetic thin film 510 (that is, the third layer of magnetic thin film 530 is nested in the first layer of magnetic thin film 510).

Likewise, a circumference of the fourth layer of magnetic thin film 540 in the first plane and a circumference of the second layer of magnetic thin film 520 in the first plane fall within a second circumference range beyond the first circumference range, and a lower limit value of the second circumference range is greater than an upper limit value of the first circumference range, that is, the fourth layer of magnetic thin film 540 and the second layer of magnetic thin film 520 are located in another group (for convenience of understanding and description, the another group is marked as a second magnetic thin film group), and have a same saturated magnetic induction intensity or magnetic permeability. For example, if the first circumference range is 20 μm to 30 μm, the second circumference range may be 35 μm to 45 μm, the upper limit value of the first circumference range is 30 μm, and the lower limit value of the second circumference range is 35 μm.

From perspective of a location relationship, the first layer of magnetic thin film 510 and the third layer of magnetic thin film 530 are both located at an inner side of the fourth layer of magnetic thin film 540 (that is, the third layer of magnetic thin film 530 and the first layer of magnetic thin film 510 are nested in the fourth layer of magnetic thin film 540), the second layer of magnetic thin film 520 may be located at an inner side of the fourth layer of magnetic thin film 540 (that is, the second layer of magnetic thin film 520 is nested in the fourth layer of magnetic thin film 540), or the fourth layer of magnetic thin film 540 may be located at an inner side of the second layer of magnetic thin film 520 (that is, the fourth layer of magnetic thin film 540 is nested in the second layer of magnetic thin film 520).

By way of example, and not limitation, the first circumference range and the second circumference range included in the thin film magnetic core 500 are described only as an example, the thin film magnetic core may include a plurality of circumference ranges that have no intersection set, that is, the thin film magnetic core not only includes the first magnetic thin film group and the second magnetic thin film group, but also may include a plurality of magnetic thin film groups. This is not limited in this embodiment of this application.

In other words, the thin film magnetic core includes a plurality of magnetic thin film groups, the first layer of magnetic thin film and the second layer of magnetic thin film may be any two magnetic thin film groups of the plurality of magnetic thin film group. In other words, if any two magnetic thin film groups of the plurality of magnetic thin film group both satisfy the foregoing technical characteristic, the plurality of magnetic thin film groups all satisfy the foregoing technical characteristic.

It should be understood that, each magnetic thin film group may include at least two layers of magnetic thin films, this application is not limited to that each group includes two layers of magnetic thin films, and two layers of magnetic thin films included in the first magnetic thin film group or the second magnetic thin film group described in this embodiment of this application are described only as an example. The first layer of magnetic thin film and a third layer of magnetic thin film in the first magnetic thin film group may be any two layers of a plurality of layers of magnetic thin films in the first magnetic thin film group, and the second layer of magnetic thin film and a fourth layer of magnetic thin film in the second magnetic thin film group may be any two layers of a plurality of layers of magnetic thin films in the second magnetic thin film group.

Figure 15:
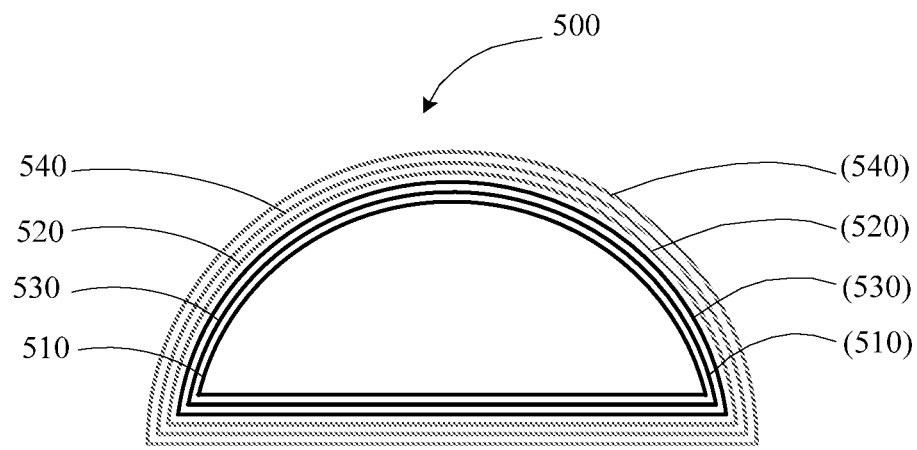
FIG. 15 is a schematic structural diagram of a thin film magnetic core according to still another embodiment of this application.

For example, as shown in a schematic structural diagram of a thin film magnetic core shown in FIG. 15, in the diagram, black lines indicate a first magnetic thin film group, and gray lines indicate a second magnetic thin film group. The first magnetic thin film group may include three layers of magnetic thin films, the first layer of magnetic thin film 510 and the third layer of magnetic thin film 530 may be magnetic thin films labeled with brackets in the diagram, or may be magnetic thin films labeled without brackets in the diagram, and the second layer of magnetic thin film 520 and the fourth layer of magnetic thin film 540 may be magnetic thin films labeled with brackets in the diagram, or may be magnetic thin films labeled without brackets in the diagram. This embodiment of this application is not limited thereto, provided that the magnetic thin films are any two magnetic thin films in a group of magnetic thin films.

With reference to the foregoing description, in this embodiment of in this application, for a plurality of layers of magnetic thin films in the thin film magnetic core, some magnetic thin films of the plurality of layers of magnetic thin films may be divided into a plurality of magnetic thin film groups, and each group includes at least two layers of magnetic thin films. As described above, all layers of magnetic thin films of remaining magnetic thin films may have saturated magnetic induction intensities that gradually become smaller or have magnetic permeabilities that gradually become larger from inside to outside.

It should be noted that, each magnetic thin film group includes at least two layers of magnetic thin films, and when the at least two layers of magnetic thin films are made of a same material, and magnetic permeabilities of the magnetic thin films need to be changed by changing thicknesses of the magnetic thin films, because circumferences of different layers of magnetic thin films in the first plane are different, thicknesses of all layers of magnetic thin films are inevitably different, to make all layers of magnetic thin films in a same magnetic thin film group have a same magnetic permeability.

Therefore, in the thin film magnetic core provided in this embodiment of this application, on one hand, the saturated magnetic induction intensity of the first layer of magnetic thin film (that is, the inner layer of magnetic thin film) is greater than the saturated magnetic induction intensity of the second layer of magnetic thin film (that is, the outer layer of magnetic thin film), so that the magnetic induction intensity that the first layer of magnetic thin film can accommodate can be effectively increased, or the magnetic permeability of the first layer of magnetic thin film is less than the magnetic permeability of the second layer of magnetic thin film, so that the magnetic induction intensity of the first layer of magnetic thin film can be effectively reduced. Therefore, both may effectively reduce a possibility that the magnetic induction intensity of the first layer of magnetic thin film is easily saturated. Moreover, compared with the problem of a relatively small inductance caused by only use of the magnetic thin film of low magnetic permeability performance to reduce the magnetic induction intensity of the first layer of magnetic thin film, this embodiment of this application can also effectively ensure an inductance of the thin film inductor.

On the other hand, the plurality of layers of magnetic thin films in the thin film magnetic core belong to at least two magnetic thin film groups, magnetic permeabilities or saturated magnetic induction intensities in each magnetic thin film group are the same, and magnetic permeabilities of a group of inner layers of magnetic thin films are less than magnetic permeabilities of a group of outer layers of magnetic thin films, or saturated magnetic induction intensities of a group of inner layers of magnetic thin films are greater than saturated magnetic induction intensities of a group of outer layers of magnetic thin films, so that not only a possibility that a magnetic induction intensity of an inner layer of magnetic thin film can be reduced, but also complexity of a manufacturing process can be reduced, thereby reducing costs.

The thin film magnetic core according to this embodiment of this application is described above with reference to FIG. 9 to FIG. 15, and a thin film inductor according to an embodiment of this application is described below with reference to FIG. 16 and FIG. 17.

Figure 16:
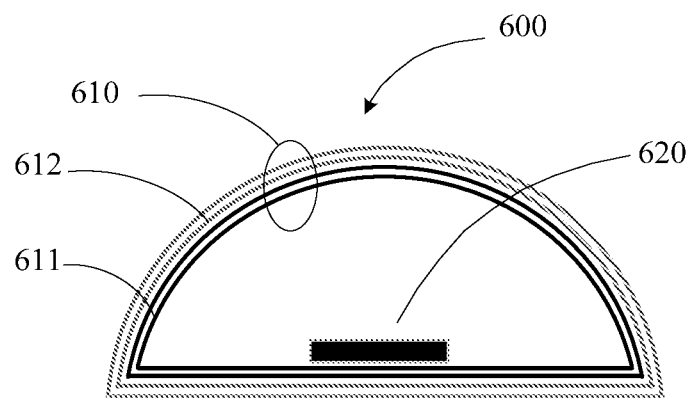
FIG. 16 is a schematic structural diagram of a thin film inductor according to an embodiment of this application.

FIG. 16 is a schematic structural diagram of a thin film inductor according to an embodiment of this application. As shown in FIG. 16, a thin film inductor 600 includes a thin film magnetic core 610 according to any one of the foregoing possible implementations, where the thin film magnetic core 610 is formed into a cavity structure, each of two ends of the cavity structure is of an opening shape, and at least one electric conductor 620, where the at least one electric conductor 620 is located in the cavity structure, a length direction of the at least one electric conductor 620 is the same as a first direction, and the first direction is a direction extending from an opening at one end of the cavity structure to an opening at the other end.

In an embodiment, the at least one electric conductor 620 (that is, a conductive winding) is placed in the cavity structure, the length direction of the electric conductor 620 is the same as the first direction, and the first direction is the direction extending from the opening at the one end of the cavity structure to the opening at the other end, so that after the at least one electric conductor 620 is powered on, a plane in which a flux loop generated by the at least one electric conductor 620 and any layer of magnetic thin film is located is parallel to or approximately parallel to a thickness direction of the magnetic thin film, that is, the plane in which the flux loop is located is a cross section shown in FIG. 16.

It should be noted that, an insulation layer is deposited between the at least one electric conductor 620 and an innermost layer of magnetic thin film (which may be, for example, a first layer of magnetic thin film 611 shown in FIG. 16), to implement insulation between the conductive winding and the magnetic thin film (which may also be understood as the thin film magnetic core).

A plurality of layers of magnetic thin films form a thin film magnetic core, that is, the thin film inductor 610 in FIG. 16. The first layer of magnetic thin film 611 and a second layer of magnetic thin film 612 may be any two layers of magnetic thin films in the thin film magnetic core 610 (that is, all magnetic thin films satisfy the foregoing characteristic), or the first layer of magnetic thin film 611 and the second layer of magnetic thin film 612 may be two particular layers of magnetic thin films of the plurality of layers of magnetic thin films included in the thin film magnetic core 600 (that is, at least two layers of magnetic thin films satisfy the foregoing condition).

The thin film magnetic core 610 may correspond to the foregoing thin film magnetic core 500. Correspondingly, the first layer of magnetic thin film 611 and the second layer of magnetic thin film 612 in the thin film magnetic core 610 correspond to the first layer of magnetic thin film 510 and the second layer of magnetic thin film 520 in the thin film magnetic core 500. For a specific characteristic description of the thin film magnetic core 610, refer to the foregoing description of the thin film magnetic core 500. Details are not described herein again.

It should be understood that, the location relationship between the first layer of magnetic thin film 611 and the second layer of magnetic thin film 612 in FIG. 16 is described only as an example, and should not constitute any limitation on this embodiment of the present disclosure. Moreover, the first layer of magnetic thin film 611 may be an inner layer of magnetic thin film, and the first layer of magnetic thin film 612 may be a magnetic thin film closest to the conductive winding, or may be not a magnetic thin film closest to the conductive winding, provided that the first layer of magnetic thin film 611 is nested in the second layer of magnetic thin film 612 (that is, the first layer of magnetic thin film 611 is located at an inner side of the second layer of magnetic thin film 612), and a saturated magnetic induction intensity or a magnetic permeability of the first layer of magnetic thin film 611 satisfies the foregoing condition. The inner layer of magnetic thin film being easily saturated can be effectively resolved using the embodiments disclosed herein.

The thin film inductor in this embodiment of this application may be a single-phase or two-phase coupled inductor. When the at least one electric conductor includes one electric conductor, the thin film inductor is single-phase, or when the at least one electric conductor includes two electric conductors, the thin film inductor is a two-phase coupled inductor.

In the thin film inductor provided in this embodiment of this application, on one hand, the saturated magnetic induction intensity of the first layer of magnetic thin film (that is, the inner layer of magnetic thin film) in the thin film inductor is greater than the saturated magnetic induction intensity of the second layer of magnetic thin film (that is, the outer layer of magnetic thin film), so that the magnetic induction intensity that the first layer of magnetic thin film can accommodate can be effectively increased, or the magnetic permeability of the first layer of magnetic thin film is less than the magnetic permeability of the second layer of magnetic thin film, so that the magnetic induction intensity of the first layer of magnetic thin film can be effectively reduced. Therefore, both may effectively reduce a possibility that the magnetic induction intensity of the first layer of magnetic thin film is easily saturated. Moreover, compared with the problem of a relatively small inductance caused by only use of the magnetic thin film of low magnetic permeability performance to reduce the magnetic induction intensity of the first layer of magnetic thin film, this embodiment of this application can also effectively ensure an inductance of the thin film inductor.

On the other hand, the plurality of layers of magnetic thin films in the thin film inductor belong to at least two magnetic thin film groups, magnetic permeabilities or saturated magnetic induction intensities in each magnetic thin film group are the same, and magnetic permeabilities of a group of inner layers of magnetic thin films are less than magnetic permeabilities of a group of outer layers of magnetic thin films, or saturated magnetic induction intensities of a group of inner layers of magnetic thin films are greater than saturated magnetic induction intensities of a group of outer layers of magnetic thin films, so that not only a possibility that a magnetic induction intensity of an inner layer of magnetic thin film can be reduced, but also complexity of a manufacturing process can be reduced, thereby reducing costs.

It should be noted that, the "parallel" described above may be understood as "approximately parallel", that is, parallel within a tolerance range and an error range based on a process for manufacturing a magnetic thin film for a person skilled in the art. Therefore, both fall within the protection scope of this application.

Figure 17:
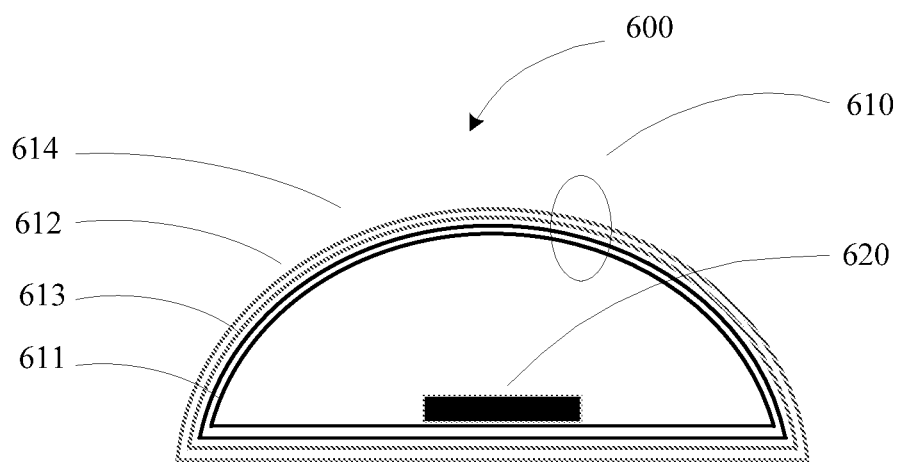
FIG. 17 is a schematic structural diagram of a thin film inductor according to another embodiment of this application.

The thin film inductor according to the embodiments of this application is described in detail above with reference to FIG. 16 and FIG. 17. As described above, the thin film inductor may be a single-phase or two-phase coupled inductor, and different thin film inductors are applicable to corresponding power conversion systems. An operating principle of a two-phase coupling thin film inductor according to an embodiment of this application in a power conversion system is described in detail below with reference to FIG. 18.

Figure 18:
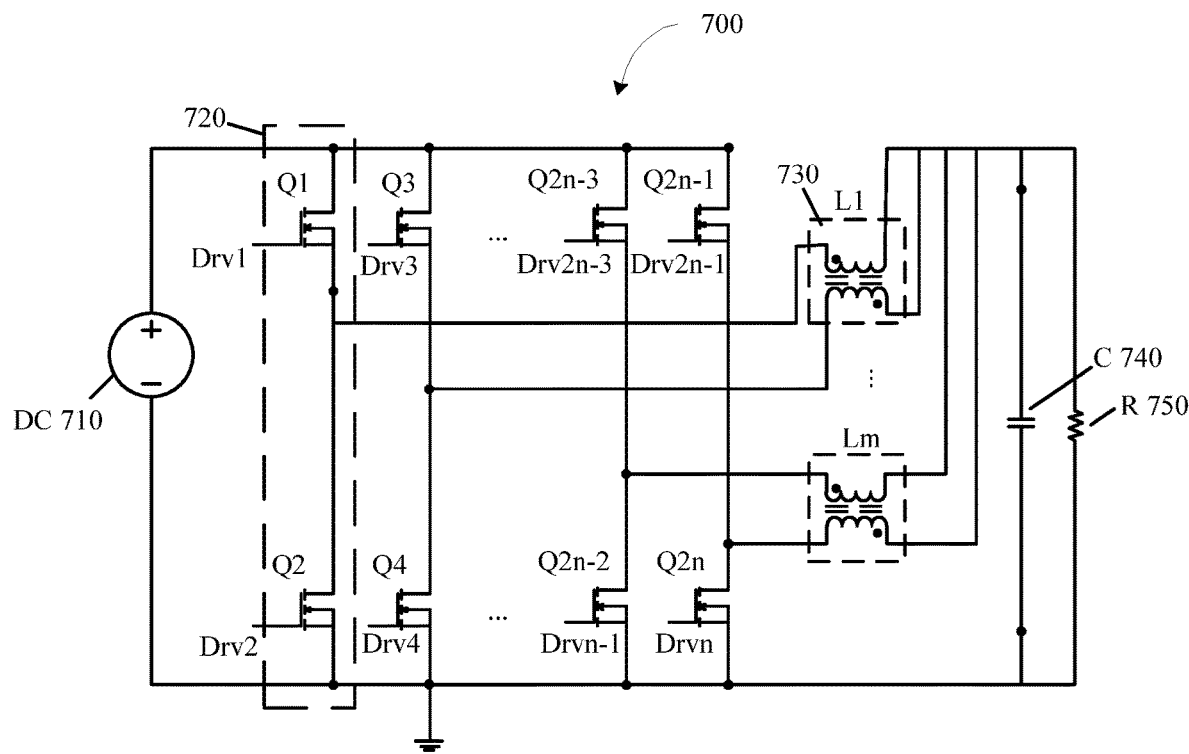
FIG. 18 is a schematic diagram of a power conversion system according to an embodiment of this application.

As shown in FIG. 18, a power conversion system 700 includes a direct current (DC) power supply 710, at least one switch unit 720, at least one inductor unit 730, a filtering capacitor 740, and a load 750. An operating principle of a circuit of the power conversion system is a multiphase interleaved buck circuit. Two phases of inductors are coupled pairwise, to form an inductor unit, and one or more inductor units are connected in parallel to provide an output to the load to provide energy. Two series-connected switching transistors (for example, switching transistors Q1 and Q2) form a switch unit. Each switching transistor is connected to a control IC using a drive (DRV) to control switch-on and switch-off of the switching transistor. At least one switch unit is in a one-to-one correspondence to at least one inductor unit, and each inductor unit is connected to the direct current power supply using a corresponding switch unit. The inductor unit may include a two-phase coupling thin film inductor described above.

Below, for convenience of understanding and description, using an inductor unit (that is, a two-phase inductor such as L1 shown in FIG. 18) as an example, an operating principle of the inductor unit is described in detail.

A first phase of power conversion circuit includes a first switch unit (for example, the switch unit including the switching transistors Q1 and Q2) and one phase of a first inductor unit (for example, the inductor L1). When the switching transistor Q1 is switched on, a direct current flows through one phase of the inductor unit connected to the switching transistor Q1, and an inductive current begins to increase, is filtered by the capacitor C, and then supplies power to the load R, and after Q1 is switched off, Q2 begins to be switched on, a voltage on the filtering capacitor is reversely applied to the inductor, and a current of the inductor begins to decrease, to complete a freewheeling current part in a BUCK conversion circuit. Likewise, a second phase of power conversion circuit includes switching transistors Q3 and Q4 and the other phase of the inductor unit L1. When the switching transistor Q3 is switched on, a direct current flows through the other phase of the inductor unit connected to the switching transistor Q4, and an inductive current begins to increase, is filtered by the capacitor C, and then supplies power to the load R, and after Q3 is switched off, Q4 begins to be switched on, a voltage on the filtering capacitor is reversely applied to the inductor, and a current of the inductor begins to decrease, to complete a freewheeling current part in a BUCK conversion circuit. The foregoing two-phase BUCK power conversion parts Q1, Q2, Q3, Q4, and the inductor unit L1 form one power conversion unit, and one or more power conversion units may be connected in parallel based on a requirement of the output load on a current.

It should be understood that, the multiphase interleaved buck circuit described above is described only as an example, and should not constitute any limitation on this application. For example, the two-phase coupling thin film inductor of this embodiment of this application may be further applied to a multiphase interleaved boost circuit. This is not particularly limited in this application.

The thin film inductor according to the embodiments of this application is described in detail above with reference to FIG. 9 to FIG. 18. A method for manufacturing a thin film inductor of an embodiment of this application is described in detail below with reference to FIG. 19 to FIG. 24 using an example in which a thin film inductor includes a first layer of magnetic thin film 611, a second layer of magnetic thin film 612, and an electric conductor.

Figure 19:
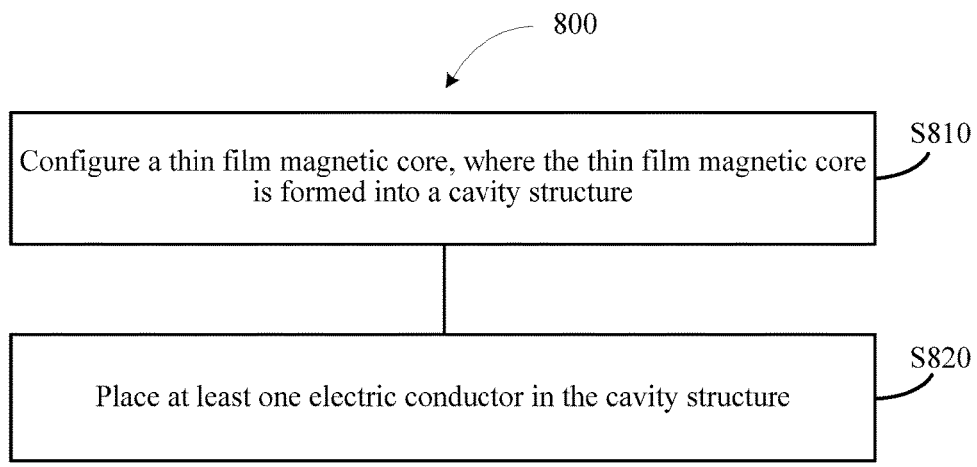
FIG. 19 is a schematic flowchart of a method for manufacturing a thin film inductor according to an embodiment of this application.

FIG. 19 is a schematic flowchart of a method for manufacturing a thin film inductor according to an embodiment of this application. As shown in FIG. 19, the manufacturing method 800 includes the following steps.

S810. Configure a thin film magnetic core 610, where the thin film magnetic core 610 is formed into a cavity structure, each of two ends of the cavity structure is of an opening shape, the thin film magnetic core 610 includes a plurality of layers of magnetic thin films, and each two adjacent layers of magnetic thin films are spaced by an insulation layer, and the plurality of layers of magnetic thin films include a first layer of magnetic thin film 611 and a second layer of magnetic thin film 612, and the first layer of magnetic thin film 611 is nested in the second layer of magnetic thin film 612, where a saturated magnetic induction intensity of the first layer of magnetic thin film 611 is greater than a saturated magnetic induction intensity of the second layer of magnetic thin film 612, a difference between the saturated magnetic induction intensity of the first layer of magnetic thin film 611 and the saturated magnetic induction intensity of the second layer of magnetic thin film 612 is greater than a first threshold, and when a magnetic permeability of the first layer of magnetic thin film 611 is greater than a magnetic permeability of the second layer of magnetic thin film 612, a difference between the magnetic permeability of the first layer of magnetic thin film 611 and the magnetic permeability of the second layer of magnetic thin film 612 is less than a second threshold, so that a magnetic induction intensity of the first layer of magnetic thin film 611 is less than the saturated magnetic induction intensity of the first layer of magnetic thin film 611, or a magnetic permeability of the first layer of magnetic thin film 611 is less than a magnetic permeability of the second layer of magnetic thin film 612, a difference between the magnetic permeability of the first layer of magnetic thin film 611 and the magnetic permeability of the second layer of magnetic thin film 612 is greater than a third threshold, and when a saturated magnetic induction intensity of the first layer of magnetic thin film 611 is less than a saturated magnetic induction intensity of the second layer of magnetic thin film 612, a difference between the saturated magnetic induction intensity of the first layer of magnetic thin film 611 and the saturated magnetic induction intensity of the second layer of magnetic thin film 612 is less than a fourth threshold, so that a magnetic induction intensity of the first layer of magnetic thin film 611 is less than the saturated magnetic induction intensity of the first layer of magnetic thin film 611.

S820. Place at least one electric conductor in the cavity structure, where a length direction of the at least one electric conductor is the same as a first direction, and the first direction is a direction extending from an opening at one end of the cavity structure to an opening at the other end.

In an embodiment, during actual technical implementation, a magnetic thin film 612-1 that is in the second layer of magnetic thin film 612 and that has a planar structure may be first formed, then a magnetic thin film 611-1 that is in the first layer of magnetic thin film 611 and that has a planar structure is formed, then an electric conductor 620 is formed, then a magnetic thin film 611-2 that is in the first layer of magnetic thin film 611 and that has a bent structure is formed, and finally a magnetic thin film 612-2 that is in the second layer of magnetic thin film 612 and that has a bent structure is formed, to finally form a thin film inductor 600.

A method for manufacturing a thin film inductor 600 according to an embodiment of this application is described in detail below with reference to FIG. 20 to FIG. 24.

Figure 20:
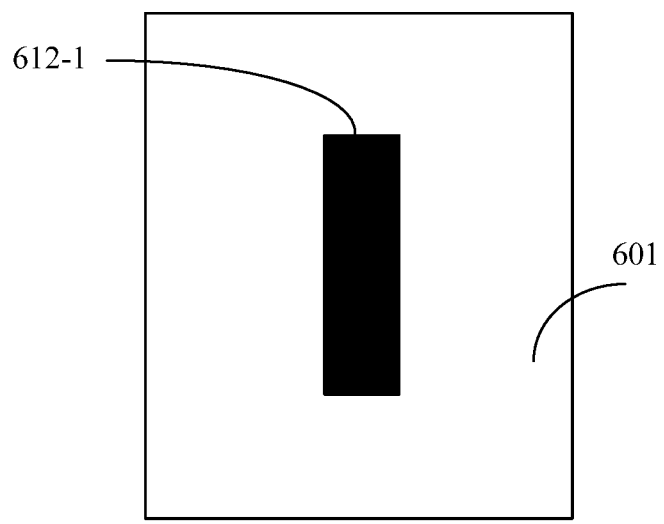
FIG. 20, FIG. 21, FIG. 22, FIG. 23, and FIG. 24 are schematic diagrams of methods for manufacturing a thin film inductor according to an embodiment of this application.

As shown in FIG. 20, a magnetic thin film 612-1 that is of a second layer of magnetic thin film 612 and that has a planar structure is first formed on a silicon substrate 601. A passivation layer is deposited on a silicon matrix of the silicon substrate 601, the passivation layer may be a coating made of silicon dioxide, silicon nitride, or another insulation organic material, and the passivation layer completely covers a surface of the silicon matrix. Then, the magnetic thin film 612-1 is formed on the silicon substrate 601, and a design shape of the magnetic thin film 612-1 is usually manufactured using a mask. The magnetic thin film 612-1 may be formed in an implementation such as chemical vapor deposition (CVD), physical vapor deposition (PVD), or atomic layer deposition (ALD).

Figure 21:
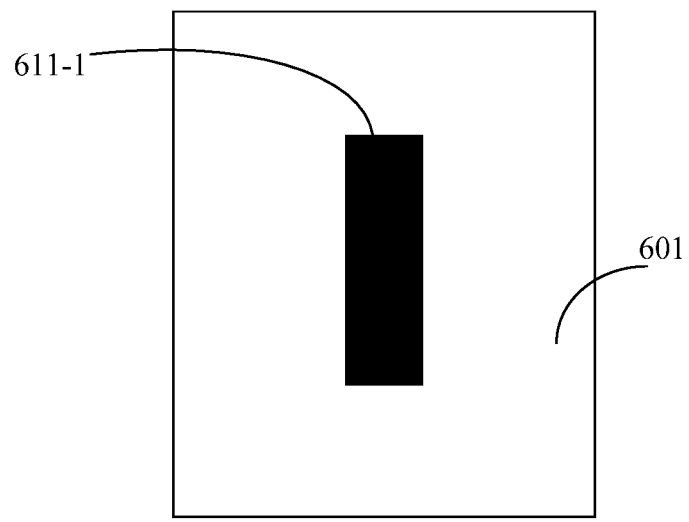

After the magnetic thin film 612-1 is manufactured, a magnetic thin film 611-1 is manufactured. As shown in FIG. 21, a design shape of the magnetic thin film 611-1 is usually manufactured using a mask, the shape is the same as that of the magnetic thin film 612-1, and a manufacturing technique of the magnetic thin film 611-1 is basically the same as a manufacturing technique of the magnetic thin film 612-1. Details are not described herein again.

It should be noted that, an insulation layer is deposited between the magnetic thin film 612-1 and the magnetic thin film 611-1, and a material of the insulation layer may be a coating made of silicon dioxide, silicon nitride, or another insulation organic material, to implement isolation between all layers of magnetic thin films. To reduce an eddy current loss of a magnetic thin film, a thickness of the magnetic thin film may be controlled to be less than 1 micrometer.

Figure 22:
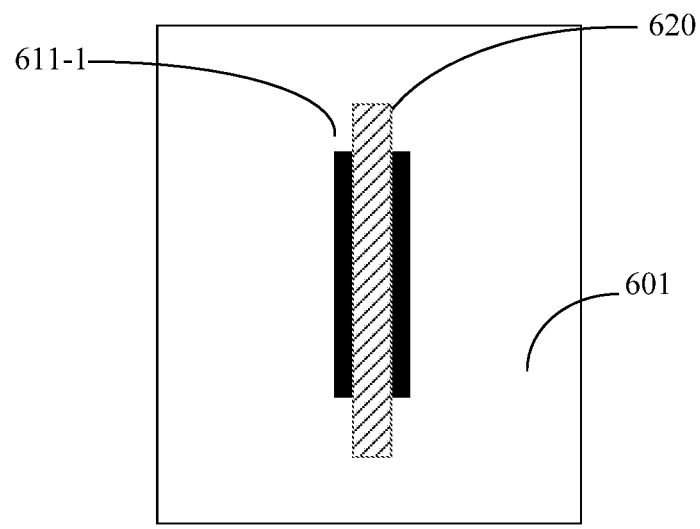

Then, after the magnetic thin film 611-1 is manufactured, an electric conductor 620 is manufactured. As shown in FIG. 22, a passivation layer is deposited on a magnetic thin film layer (that is, a magnetic thin film layer at which the magnetic thin film 611-1 is located) of the silicon substrate 601, the passivation layer may be a coating made of silicon dioxide, silicon nitride, or another insulation organic material, and the passivation layer completely covers a surface of the silicon matrix 603. On the passivation layer, a conductive seed layer is deposited on an entire silicon wafer using a vapor deposition technique. Next, a photoresist etching material layer is deposited and etched to form a photoresist etching mask covering a part of a seed layer. Next, using a standard electroplating technology, the electric conductor 620 is electroplated on the seed layer, to form a conductive winding part in the thin film inductor. After electroplating is completed, the photoresist etching mask needs to be removed, and the residual seed layer is removed using reactive ion etching (RIE) method or another appropriate etching method.

After the electric conductor 620 is manufactured, one more insulation layer needs to be deposited, to cover the electric conductor 620, and a shape of the insulation layer may be the same as a shape of a magnetic thin film 611-2.

Figure 23:
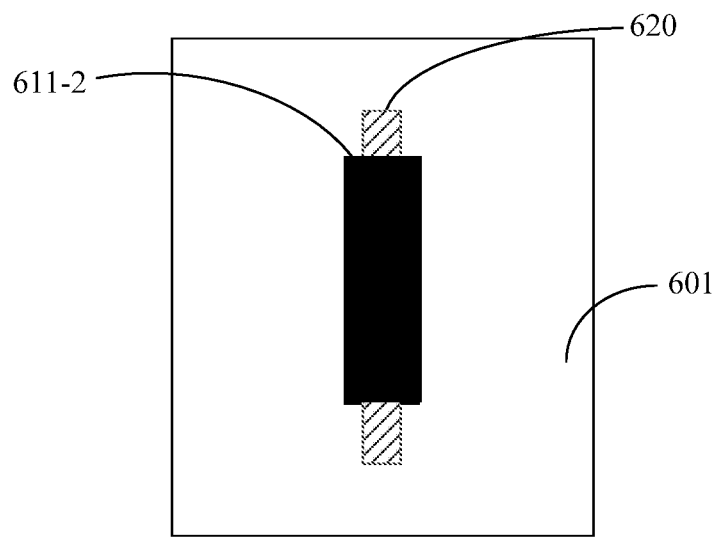

Then, as shown in FIG. 23, the magnetic thin film 611-2 that is of a second layer of magnetic thin film 612 and that has a bent structure is formed on the silicon substrate 601. The magnetic thin film 611-2 covers the insulation layer having the bent structure, a design shape of the magnetic thin film 611-2 is usually manufactured using a mask, and the shape is the same as that of the magnetic thin film 611-1. A manufacturing technique of the magnetic thin film 611-2 is basically the same as the manufacturing technique of the magnetic thin film 611-1, and details are not described herein again.

Figure 24:
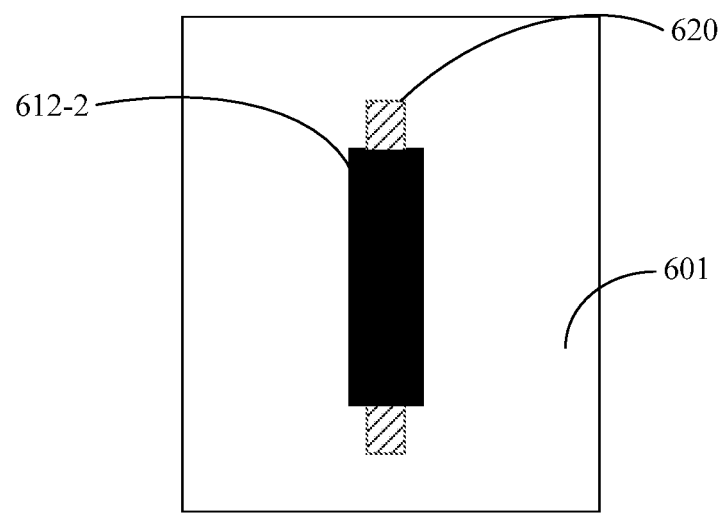

Then, a magnetic thin film 612-2 is manufactured. As shown in FIG. 24, a design shape of the magnetic thin film 612-2 is usually manufactured using a mask, the shape is the same as that of the magnetic thin film 612-1, and a manufacturing technique of the magnetic thin film 612-2 is basically the same as the manufacturing technique of the magnetic thin film 612-1. Details are not described herein again.

Likewise, an insulation layer is deposited between the magnetic thin film 611-2 and the magnetic thin film 612-2, and a material of the insulation layer may be a coating made of silicon dioxide, silicon nitride, or another insulation organic material, to implement isolation between all layers of magnetic thin films. To reduce an eddy current loss of a magnetic thin film, a thickness of the magnetic thin film may be controlled to be less than 1 micrometer.

It should be noted that, in a magnetic thin film sputtering or electroplating deposition process, an externally applied magnetic field is required to control anisotropy of a magnetic thin film material, and a direction of the externally applied magnetic field needs to be along a direction of an easy magnetization axis.

It should be understood that, sequence numbers of the foregoing procedures for manufacturing a thin film inductor do not indicate an execution order, and the execution order of the procedures should be determined according to a function and inherent logic thereof, and should not constitute any limitation on an implementation process of this embodiment of this application.

It should be noted that, the foregoing procedures for manufacturing a thin film inductor including three components, namely, a first layer of magnetic thin film, a second layer of magnetic thin film, and an electric conductor are described only as an example. When a thin film inductor includes a plurality of electric conductors and at least two layers of magnetic thin films, procedures for manufacturing each winding and each layer of magnetic thin film are similar to those in the foregoing method, and all fall within the protection scope of the embodiments of this application.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. The described apparatus embodiment is merely an example and the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units may be integrated into one unit.

When functions are implemented in the form of a software functional unit and sold or used as an independent product, the functions may be stored in a computer-readable storage medium. Based on such an understanding, the technical solutions of the embodiments of this application essentially, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of the embodiments of this application. Any variation or replacement readily figured out by a person skilled in the art within the technical scope disclosed in the embodiments of this application shall fall within the protection scope of the embodiments of this application. Therefore, the protection scope of the embodiments of this application shall be subject to the protection scope of the claims.

What is claimed is:

1. A thin film inductor, comprising:
 a thin film magnetic core comprising a cylindrical structure having openings at two ends, wherein the thin film magnetic core further comprises a plurality of layers of magnetic thin films, wherein each layer of magnetic thin film is of the cylindrical structure having openings at two ends, wherein the plurality of layers of magnetic thin films are nested layer upon layer, wherein an insulation layer is disposed between each two adjacent layers of the plurality of layers of magnetic thin films, and wherein the plurality of layers of magnetic thin films comprise:
  a first magnetic thin film; and
  a second magnetic thin film adjacent to the first magnetic thin film with an insulation layer disposed between the first magnetic thin film and the second magnetic thin film, wherein the first magnetic thin film is nested in the second magnetic thin film, wherein a relative magnetic permeability of the first magnetic thin film is less than a relative magnetic permeability of the second magnetic thin film, wherein a difference between the relative magnetic permeability of the first magnetic thin film and the relative magnetic permeability of the second magnetic thin film is greater than or equal to a first threshold, wherein a magnetic induction intensity of the first magnetic thin film is less than or equal to a saturated magnetic induction intensity of the first magnetic thin film when a magnetic induction intensity of the second magnetic thin film reaches a saturated magnetic induction intensity of the second magnetic thin film; and an electric conductor located in an inner cavity of an innermost layer of magnetic thin film of the plurality of layers of magnetic thin films.

2. The thin film inductor according to claim 1, wherein each two adjacent layers of the plurality of layers of magnetic thin films comprise an inner layer of magnetic thin film and an outer layer of magnetic thin film, wherein the inner layer of magnetic thin film is nested in the outer layer of magnetic thin film, wherein a difference between a relative magnetic permeability of the inner layer of magnetic thin film and a relative magnetic permeability of the outer layer of magnetic thin film is greater than or equal to the first threshold, wherein a magnetic induction intensity of the inner layer of magnetic thin film is less than or equal to a saturated magnetic induction intensity of the inner layer of magnetic thin film when a magnetic induction intensity of the outer layer of magnetic thin film reaches a saturated magnetic induction intensity of the outer layer of magnetic thin film.

3. The thin film inductor according to claim 1, wherein the first threshold is 50 henries per meter (H/m).

4. The thin film inductor according to claim 1, wherein a thickness of the first magnetic thin film is equal to a thickness of the second magnetic thin film, and wherein the first magnetic thin film and the second magnetic thin film are made of different materials.

5. The thin film inductor according to claim 1, wherein the first magnetic thin film and the second magnetic thin film are made of a common material, wherein a thickness of the first magnetic thin film is greater than a thickness of the second magnetic thin film, wherein a difference between the thickness of the first magnetic thin film and the thickness of the second magnetic thin film is greater than 0 and is less than or equal to a second threshold, and wherein the second threshold is five times the thickness of the second magnetic thin film.

6. The thin film inductor according to claim 1, wherein a material of the first magnetic thin film comprises $Ni_{45}Fe_{55}$ and a material of the second magnetic thin film comprises $Ni_{80}Fe_{20}$, the material of the first magnetic thin film comprises CoZrO and the material of the second magnetic thin film comprises CoZrTa, the material of the first magnetic thin film comprises CoZrO and the material of the second magnetic thin film comprises $Ni_{80}Fe_{20}$, or the material of the first magnetic thin film comprises CoZrTa and the material of the second magnetic thin film comprises $Ni_{80}Fe_{20}$.

7. The thin film inductor according to claim 1, wherein a length direction of the conductor is the same as a length direction of the innermost layer of magnetic thin film, wherein the length direction of the innermost layer of magnetic thin film is a direction extending from an opening at one end of the innermost layer of magnetic thin film to an opening at another end of the innermost layer of magnetic thin film, wherein the electric conductor and an inner wall of the innermost layer of magnetic thin film are insulated from each other, wherein at least two electric conductors are isolated from each other when the thin film inductor comprises the at least two electric conductors.

8. The thin film inductor according to claim 1, wherein each layer of magnetic thin film of the thin film inductor comprises a first part and a second part, wherein the first part has a first end and a second end, and wherein the first end and the second end are in contact with different areas of the second part.

9. The thin film inductor according to claim 1, wherein the relative magnetic permeability of the second magnetic thin film is based on a circumference of the second magnetic thin film in a first plane and the saturated magnetic induction intensity of the second magnetic thin film, wherein the first plane is a plane in which a cross section of the second magnetic thin film is located and the first plane is perpendicular to a first direction is located, and wherein the first direction extends from an opening at one end of the second magnetic thin film to an opening at another end of the second magnetic thin film.

10. A power conversion circuit, comprising:
a thin film inductor, comprising:
a thin film magnetic core comprising a cylindrical structure having openings at two ends, wherein the thin film magnetic core further comprises a plurality of layers of magnetic thin films, wherein each layer of magnetic thin film is of the cylindrical structure having openings at two ends, wherein the plurality of layers of magnetic thin films are nested layer upon layer, wherein an insulation layer is positioned between each two adjacent layers of the plurality of layers of magnetic thin films, and wherein the plurality of layers of magnetic thin films comprise:
a first magnetic thin film; and
a second magnetic thin film adjacent to the first magnetic thin film with the insulation layer disposed between the first magnetic thin film and the second magnetic thin film, wherein the first magnetic thin film is nested in the second magnetic thin film, wherein a relative magnetic permeability of the first magnetic thin film is less than a relative magnetic permeability of the second magnetic thin film, wherein a difference between the relative magnetic permeability of the first magnetic thin film and the relative magnetic permeability of the second magnetic thin film is greater than or equal to a first threshold, wherein a magnetic induction intensity of the first magnetic thin film is less than or equal to a saturated magnetic induction intensity of the first magnetic thin film when a magnetic induction intensity of the second magnetic thin film reaches a saturated magnetic induction intensity of the second magnetic thin film; and
an electric conductor located in an inner cavity of an innermost layer of magnetic thin film of the plurality of layers of magnetic thin films;
a capacitor comprising a first end and a second end, wherein an end of the thin film inductor is connected to the first end of the capacitor;
a first switching transistor comprising an end; and
a second switching transistor comprising a first end and a second end, wherein the end of the first switching transistor is connected to the first end of the second switching transistor, wherein the second end of the second switching transistor is connected to the second end of the capacitor, and wherein another end of the thin film inductor is connected between the end of the first switching transistor and the end of the second switching transistor.

11. The power conversion circuit according to claim 10, wherein each two adjacent layers of the plurality of layers of magnetic thin films comprise an inner layer of magnetic thin film and an outer layer of magnetic thin film, wherein the inner layer of magnetic thin film is nested in the outer layer of magnetic thin film, wherein a difference between a relative magnetic permeability of the inner layer of magnetic thin film and a relative magnetic permeability of the outer layer of magnetic thin film is greater than or equal to the first threshold, wherein a magnetic induction intensity of the inner layer of magnetic thin film is less than or equal to a saturated magnetic induction intensity of the inner layer of magnetic thin film when a magnetic induction intensity of the outer layer of magnetic thin film reaches a saturated magnetic induction intensity of the outer layer of magnetic thin film.

12. The power conversion circuit according to claim 10, wherein the first threshold is 50 henries per meter (H/m).

13. The power conversion circuit according to claim 10, wherein the first magnetic thin film and the second magnetic thin film are made of a different materials, wherein a thickness of the first magnetic thin film is equal to a thickness of the second magnetic thin film.

14. The power conversion circuit according to claim 10, wherein the first magnetic thin film and the second magnetic thin film are made of a common material, wherein a thickness of the first magnetic thin film is greater than a thickness of the second magnetic thin film, wherein a difference between the thickness of the first magnetic thin film and the thickness of the second magnetic thin film is greater than 0 and is less than or equal to a second threshold, and wherein the second threshold is five times the thickness of the second magnetic thin film.

15. A chip, comprising:
a power conversion circuit, comprising;
  a thin film inductor, comprising:
    a first end;
    a second end;
    a thin film magnetic core being of a cylindrical structure having openings at two ends, wherein the thin film magnetic core comprises a plurality of layers of magnetic thin films, wherein each layer of magnetic thin film is of the cylindrical structure having openings at two ends, wherein the plurality of layers of magnetic thin films are nested layer upon layer, wherein an insulation layer is positioned between each two adjacent layers the plurality of layers of magnetic thin films, and wherein the plurality of layers of magnetic thin films comprise:
      a first magnetic thin film; and
      a second magnetic thin film adjacent to the first magnetic thin film with the insulation layer disposed between the first magnetic thin film and the second magnetic thin film, wherein the first magnetic thin film is nested in the second magnetic thin film, wherein a relative magnetic permeability of the first magnetic thin film is less than a relative magnetic permeability of the second magnetic thin film, wherein a difference between the relative magnetic permeability of the first magnetic thin film and the relative magnetic permeability of the second magnetic thin film is greater than or equal to a first threshold, wherein a magnetic induction intensity of the first magnetic thin film is less than or equal to a saturated magnetic induction intensity of the first magnetic thin film when a magnetic induction intensity of the second magnetic thin film reaches a saturated magnetic induction intensity of the second magnetic thin film; and
    an electric conductor located in an inner cavity of an innermost layer of magnetic thin film of the plurality of layers of magnetic thin films;
  a capacitor comprising a first end and a second end, wherein a first end of the capacitor is connected to a first end of the thin film inductor;
  a first switching transistor comprising an end;
  a second switching transistor comprising a first end and a second end, wherein the end of the first switching transistor is connected to the first end of the second switching transistor, wherein the second end of the second switching transistor is connected to the second end of the capacitor, wherein the second end of the thin film inductor is connected between the end of the first switching transistor and the first end of the second switching transistor;
  wherein a current that is from an external power supply and that flows through the thin film inductor increases;
  wherein a voltage between the first and the second end of the capacitor is reversely loaded on the thin film inductor and a current flowing through the thin film inductor decreases when the first switching transistor is switched off and the second switching transistor is switched on.

16. The chip according to claim 15, wherein the chip further comprises a load, wherein the power conversion circuit is connected to the load, and wherein the power conversion circuit is configured to:
  receive the current from an external power supply;
  convert the current; and
  supply the current to the load after converting the current.

17. The chip according to claim 15, wherein each two adjacent layers of the plurality of layers of magnetic thin films comprise an inner layer of magnetic thin film and an outer layer of magnetic thin film, wherein the inner layer of magnetic thin film is nested in the outer layer of magnetic thin film, wherein a difference between a relative magnetic permeability of the inner layer of magnetic thin film and a relative magnetic permeability of the outer layer of magnetic thin film is greater than or equal to the first threshold, wherein a magnetic induction intensity of the inner layer of magnetic thin film is less than or equal to a saturated magnetic induction intensity of the inner layer of magnetic thin film when a magnetic induction intensity of the outer layer of magnetic thin film reaches a saturated magnetic induction intensity of the outer layer of magnetic thin film.

18. The chip according to claim 15, wherein the first threshold is 50 henries per meter (H/m).

19. The chip according to claim 15, wherein the first magnetic thin film and the second magnetic thin film are made of different materials, and wherein a thickness of the first magnetic thin film is equal to a thickness of the second magnetic thin film.

20. The chip according to claim 15, wherein the first magnetic thin film and the second magnetic thin film are made of a common material, wherein a thickness of the first magnetic thin film is greater than a thickness of the second magnetic thin film, wherein a difference between the thickness of the first magnetic thin film and the thickness of the second magnetic thin film is greater than 0 and is less than or equal to a second threshold, wherein and the second threshold is five times the thickness of the second magnetic thin film.

\* \* \* \* \*